(12) United States Patent
Yamaguchi

(10) Patent No.: US 8,168,370 B2
(45) Date of Patent: May 1, 2012

(54) LITHOGRAPHIC PRINTING PLATE PRECURSOR AND METHOD FOR PREPARING LITHOGRAPHIC PRINTING PLATE

(75) Inventor: Shuhei Yamaguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 248 days.

(21) Appl. No.: 12/054,731

(22) Filed: Mar. 25, 2008

(65) Prior Publication Data

US 2008/0241739 A1 Oct. 2, 2008

(30) Foreign Application Priority Data

Mar. 26, 2007 (JP) ................................. 2007-080288

(51) Int. Cl.
G03F 7/027 (2006.01)
G03F 7/00 (2006.01)
G03F 7/004 (2006.01)
G03F 7/11 (2006.01)

(52) U.S. Cl. ............... 430/283.1; 430/284.1; 430/285.1; 430/286.1; 430/287.1; 430/302

(58) Field of Classification Search ........................ None
See application file for complete search history.

(56) References Cited

U.S. PATENT DOCUMENTS

| 5,290,663 | A | * | 3/1994 | Huynh-Tran | 430/284.1 |
| 6,858,373 | B2 | * | 2/2005 | Kunita | 430/281.1 |
| 2002/0023565 | A1 | | 2/2002 | Kawamura et al. | |
| 2003/0064318 | A1 | * | 4/2003 | Huang et al. | 430/270.1 |
| 2004/0013968 | A1 | | 1/2004 | Teng | |
| 2004/0062939 | A1 | * | 4/2004 | Shimada et al. | 428/474.4 |
| 2005/0142483 | A1 | * | 6/2005 | Yamasaki | 430/270.1 |
| 2006/0216646 | A1 | * | 9/2006 | Goto et al. | 430/302 |
| 2007/0212641 | A1 | * | 9/2007 | Wakata et al. | 430/270.1 |

FOREIGN PATENT DOCUMENTS

| JP | 2002-29163 A | 1/2002 |
| JP | 2002-365789 A | 12/2002 |
| JP | 2005-231347 A | 9/2005 |

OTHER PUBLICATIONS

Office Action dated Jul. 19, 2011 in Japanese Patent Application No. 2007-080288.
Office Action dated Jul. 19, 2011 in corresponding Japanese Patent Application No. 2007-080288.

* cited by examiner

*Primary Examiner* — Cynthia Hamilton
(74) *Attorney, Agent, or Firm* — Sughrue Mion, PLLC

(57) ABSTRACT

A lithographic printing plate precursor includes a support; and an image forming layer formed from a photosensitive composition, wherein the photosensitive composition includes: a photopolymerization initiator; a polymerizable compound; and a binder polymer including a graft chain, and the graft chain is a hydrophilic graft chain including a hydrophilic group.

14 Claims, 1 Drawing Sheet

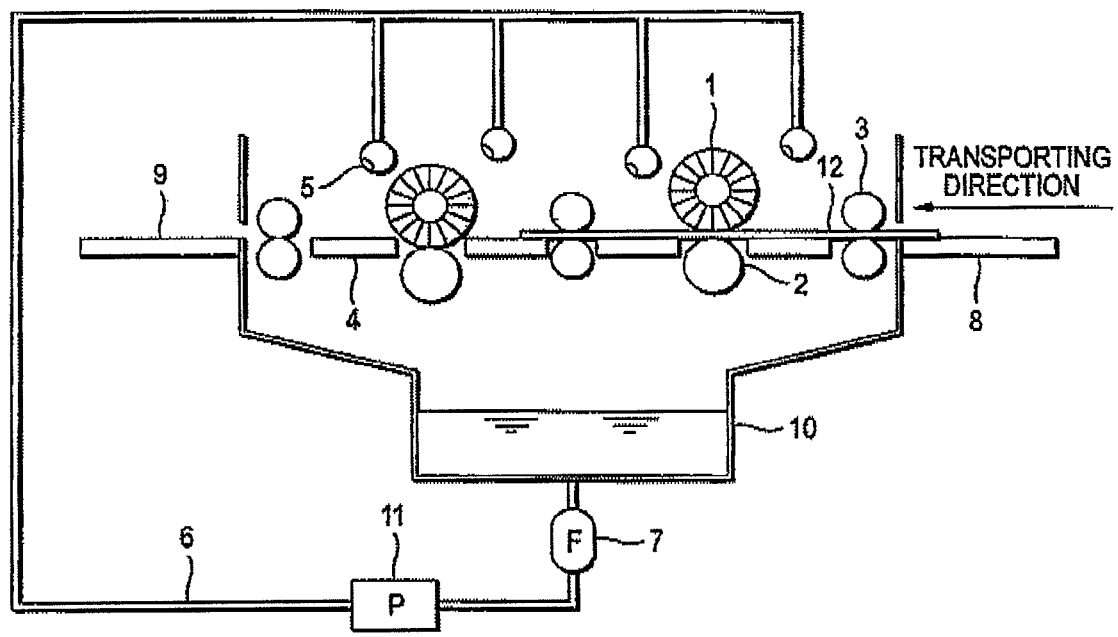

LITHOGRAPHIC PRINTING PLATE PRECURSOR AND METHOD FOR PREPARING LITHOGRAPHIC PRINTING PLATE

BACKGROUND OF THE INVENTION

1. Field of the Invention

This invention relates to a lithographic printing plate precursor and a method for preparing a lithographic printing plate using the same.

2. Description of the Related Art

In general, a lithographic printing plate has a surface consisting of an oleophilic image area and a hydrophilic non-image area. Lithographic printing means a printing method that comprises alternately supplying a fountain solution and an oily ink on the surface of lithographic printing plate, making the hydrophilic non-image area a fountain solution-receptive area (an ink unreceptive area), allowing the oleophilic image area alone to receive the ink by utilizing the nature of the fountain solution and the oily ink to repel with each other, and then transferring the ink to a printing material such as paper.

To prepare the lithographic printing plate, there has been widely employed a lithographic printing plate precursor (a PS plate) comprising a hydrophilic support and an oleophilic image forming layer (hereinafter also called "a photosensitive layer"). Ordinarily, a lithographic printing plate is obtained by a plate making process which comprises exposing the lithographic printing plate precursor through an original such as a lith film, and, while leaving the image forming layer serving as the image areas removing the image forming layer in the unnecessary non-image area by dissolving in an alkaline developing solution or an organic solvent thereby exposing the surface of the hydrophilic support to form the non-image area.

In the existing plate-making process of lithographic printing plate precursor, it is required to employ after the exposure the step of removing the unnecessary image forming layer by dissolving in a developing solution or the like. Thus, it is one of the problems to be solved to simplify such an additional wet treatment described above. As one simplification means, it is desirable if the development can be carried out with a nearly neutral aqueous solution or simply with water.

With the recent spread of digitalized technique of electronically processing, accumulating and outputting image information using a computer, on the other hand, various new image outputting systems fitting for the digitalized technique have been put into practical use. Accordingly, attention has been drawn to a computer-to-plate technique wherein digitalized image information is carried on highly converging radiation such as laser beams and a lithographic printing plate precursor is scan-exposed with the light thereby directly preparing a lithographic printing plate without resorting to a lith film. Thus, it is one of the important technical problems to obtain a lithographic printing plate precursor appropriate for the technique described above.

Under these circumstances, it has been urgently required more than before to provide a plate making operation that is appropriate for both simplification and digitalization.

To meet the above-described requirement, for instance, JP-A-2002-365789 discloses that by incorporating a compound having an ethylene oxide chain into an image forming layer of a lithographic printing plate precursor comprising a hydrophilic support and the image forming layer containing a hydrophobic precursor, a hydrophilic resin and a light-to-heat converting agent, the lithographic printing plate precursor becomes usable not only in on-press development but also in printing following exposure and wet development processing with the use of water or an appropriate aqueous solution as a developing solution.

Further, US 2004/0013968 discloses a processing method of lithographic printing plate precursor which comprises preparing a lithographic printing plate precursor comprising (i) a hydrophilic support and (ii) an oleophilic heat-sensitive layer which contains a radical-polymerizable ethylenically unsaturated monomer, a radical polymerization initiator and an infrared absorbing dye, is hardened with infrared laser exposure and is developable with an aqueous developing solution containing 60% by mass or more of water and having pH of 2.0 to 10.0, exposing imagewise the lithographic printing plate precursor with an infrared laser, and removing the unhardened area of the heat-sensitive layer with the aqueous developing solution.

SUMMARY OF THE INVENTION

An aspect of the invention is to provide a lithographic printing plate precursor, which is excellent in developability with water or an aqueous developing solution and also in printing durability, and a method for preparation of a lithographic printing plate.

The inventors have solved by the problems as described above by using a binder polymer having a graft chain in the photosensitive layer and employing a hydrophilic graft chain having a hydrophilic group as the above-described graft chain. Accordingly, the invention includes the following constructions.

<1> A lithographic printing plate precursor comprising:
a support; and
an image forming layer formed from a photosensitive composition,
wherein
the photosensitive composition comprises:
a photopolymerization initiator;
a polymerizable compound; and
a binder polymer comprising a graft chain, and
the graft chain is a hydrophilic graft chain comprising a hydrophilic group.

<2> The lithographic printing plate precursor as described in <1>, wherein
the hydrophilic graft chain comprises the hydrophilic group in a side chain thereof.

<3> The lithographic printing plate precursor as described in <1>, wherein
the binder polymer has an acid value of 0.3 meq/g or less.

<4> The lithographic printing plate precursor as described in <1>, wherein
the image forming layer in an unexposed area can be removed in the presence of a developing solution having pH of 2 to 10.

<5> The lithographic printing plate precursor as described in <1>, wherein
a main chain of the binder polymer comprising a graft chain is a (meth)acrylic resin or a polyurethane resin.

<6> The lithographic printing plate precursor as described in <1>, wherein
the hydrophilic graft chain comprises a crosslinkable group.

<7> The lithographic printing plate precursor as described in <1>, wherein
a main chain of the binder polymer comprising a graft chain comprises a crosslinking group.

<8> The lithographic printing plate precursor as described in <1>, wherein
the photosensitive composition comprises a sensitizing dye which absorbs light of from 350 to 450 nm.

<9> A method for preparing a lithographic printing plate with a lithographic printing plate precursor comprising a support and an image forming layer, wherein the image forming layer is formed from a photosensitive composition comprising (A) a sensitizing dye absorbing light of from 350 nm to 450 nm, (B) a polymerization initiator, (C) a polymerizable compound and (D) a binder polymer comprising a graft chain which is a hydrophilic graft chain comprising a hydrophilic group,
the method comprising:
exposing the image forming layer with an exposure apparatus equipped with a light source having an oscillation wavelength of 350 nm to 450 nm; and
rubbing the image forming layer with a rubbing member by an automatic processor provided with the rubbing member to thereby remove the image forming layer in an unexposed area.

BRIEF DESCRIPTION OF THE DRAWING

FIGURE shows the structure of an automatic development processor.

DETAILED DESCRIPTION OF THE INVENTION

Lithographic Printing Plate Precursor

First, the lithographic printing plate precursor to be used in the invention will be described.

The lithographic printing plate precursor to be used in the invention is characterized by having, on a support a photosensitive layer formed by a photosensitive composition which contains (A) if necessary, a sensitizing dye, (B) a polymerization initiator, (C) a polymerizable compound and (D) a binder polymer wherein the binder polymer (D) has a graft chain which is a hydrophilic graft chain having a hydrophilic group.

Next, the lithographic printing plate precursor will be illustrated in greater detail.

<Photosensitive Layer>

The photosensitive layer of the lithographic printing plate precursor in the invention, which is a photosensitive layer which can be removed in the presence of water or an aqueous developing solution, is a polymerizable negative-working photosensitive layer formed by a photosensitive component containing, as the essential components, (B) a polymerization initiator, (C) a polymerizable compound and (D) a binder polymer of a specific structure, optionally together with (A) a sensitizing dye and another colorant and additional arbitrary components.

The development speed in the unexposed area of the photosensitive layer and the penetration speed of a developing solution into the hardened photosensitive layer can be controlled by a method commonly employed in the art, in addition to the method of using (D) a binder polymer of a specific structure as described above. To elevate the development speed in an unexposed area, for example, it is effective to add a hydrophilic. To control the penetration of a developing solution into an exposed area, it is effective to add a hydrophobic compound.

(A) Sensitizing Dye

The sensitizing dye absorbing light of 350 to 450 nm to be used in the photosensitive composition employed in the invention preferably has an absorption maximum in a wavelength range of 350 to 450 nm. Examples of the sensitizing dye include merocyanine dyes represented by the following general formula (I), benzopyranes or coumarins represented by the following general formula (II), aromatic ketones represented by the following general formula (III), anthracenes represented by the following general formula (IV) and so on.

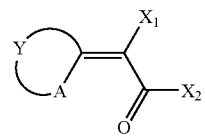
(I)

In this formula, A represents a sulfur atom or N; $R_6$ represents a monovalent non-metallic atomic group; Y represents a non-metallic atomic group forming a basic nucleus of the dye together with adjacent A and the adjacent carbon atom; and $X_1$ and $X_2$ each independently represents a monovalent non-metallic atomic group or $X_1$ and $X_2$ may be bonded to each other to form an acidic nucleus of the dye.

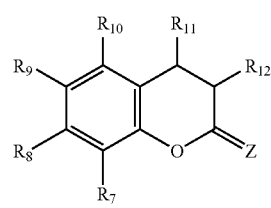
(II)

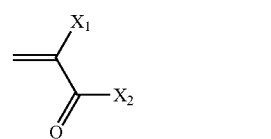
(I')

In this formula, =Z represents a carbonyl group, a thiocarbonyl group, an imino group or an alkylydene group represented by the partial structural formula (I') described above; $X_1$ and $X_2$ have the same meanings as defined in the general formula (II) respectively; and $R_7$ to $R_{12}$ each independently represents a monovalent non-metallic atomic group.

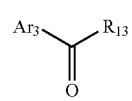
(III)

In this formula, $Ar_3$ represents an aromatic group or a heteroaromatic group which may have a substituent; and $R_{13}$ represents a monovalent nonmetallic atomic group. $R_{13}$ preferably represents an aromatic group or a heteroaromatic group. $Ar_3$ and $R_{13}$ may be bonded each other to form a ring.

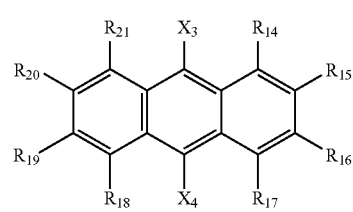
(IV)

In this formula, $X_3$, $X_4$ and $R_{14}$ to $R_{21}$ each independently represents a monovalent non-metallic atomic group. Preferably, $X_3$ and $X_4$ each independently represents an electron-donating group having a negative Hammett substituent constant.

In the general formulae (I) to (IV), preferable examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a phenyl group, a cyanophenyl group, a sulfophenyl group, a sulfonatophenyl group, a phosphonophenyl group or a phosphonatophenyl group), a heteroaryl group (for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perinidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent carbon atom in the general formula (I) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, use can be appropriately made of those which are known to constitute basic nuclei in merocyanine dyes described in, for example, L. G. Brooker et al, *J. Am. Chem. Soc.*, Vol. 73, p. 5326 to 5358 (1951) and references cited therein. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphth[1,2]selenazole or naphtho[2,1]selenazole); thiazolines (for example, thiazoline or 4-methylthiazoline); 2-quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); 4-quinolines (for example, quinoline, 6-methoxyquinoline, 7-methylquinoline or 8-methylquinoline); 1-isoquinolines (for example, isoquinoline or 3,4-dihydroisoquinoline); 3-isoquinolines (for example, isoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); 2-pyridines (for example, pyridine or 5-methylpyridine); and 4-pyridines (for example, pyridine).

Examples of the sulfur-containing heterocyclic ring include dithiol partial structures in dyes described in JP-A-3-296759. Specific examples thereof include benzodithiols (for example, benzodithiol, 5-t-butylbenzodithiol or 5-methylbenzodithiol); naphthodithiols (for example, naphtho[1,2]dithiol or naphtho[2,1]dithiol); and dithiols (for example, 4,5-dimethyldithiols, 4-phenyldithiols, 4-methoxycarbonyldithiols, 4,5-dimethoxycarbonyldithiols, 4,5-ditrifluoromethyldithiol, 4,5-dicyanodithiol, 4-methoxycarbonylmethyldithiol or 4-carboxymethyldithiol).

In the above description concerning the heterocyclic ring, the names of heterocyclic mother skeletons are used for convenience and by convention. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolilydene group.

Among the compounds having an absorption maximum in a wavelength range of 350 nm to 450 nm as the sensitizing dyes, dyes represented by the following general formula (V) are more preferable in view of high sensitivity.

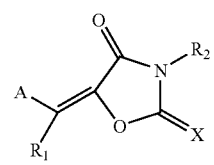

(V)

In the general formula (V), A represents an aromatic cyclic group or a heterocyclic group which may have a substituent; X represents an oxygen atom, a sulfur atom or $=N(R_3)$; and $R_1$, $R_2$ and $R_3$ each independently represents a hydrogen atom or a monovalent non-metallic atomic group, or A and $R_1$ or $R_2$ and $R_3$ may be bonded to each other to form an aliphatic or aromatic ring.

Next, the general formula (V) will be described in greater detail. $R_1$, $R_2$ and $R_3$ each independently represents a hydrogen atom or a monovalent non-metallic atomic group, preferably a substituted or unsubstituted alkyl group, a substituted or unsubstituted alkenyl group, a substituted or unsubstituted aryl group, a substituted or unsubstituted heteroaryl group, a substituted or unsubstituted alkoxy group, a substituted or unsubstituted alkylthio group, a hydroxy group or a halogen atom.

Now, preferable examples of $R_1$, $R_2$ and $R_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, use is made of a monovalent non-metallic atomic group exclusive of a hydrogen atom. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OP$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group, a nitro group, an aryl group, a heteroaryl group, an alkenyl group and an alkynyl group.

In these substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group.

Examples of the heteroaryl group which is preferable as $R_1$, $R_2$ and $R_3$ include a monocyclic or polycyclic aromatic cyclic group containing at least one of a nitrogen atom, an oxygen atom and a sulfur atom. Examples of especially preferable heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine. These groups may be benzo-fused or may have a substituent.

Also, examples of the alkenyl group which is preferable as $R_1$, $R_2$ and $R_3$ include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of G1 in the acyl group (G1CO—) include a hydrogen atom and the above-described alkyl group and aryl group. Among these substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any of $R_1$, $R_2$ and $R_3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among these groups, a phenyl group and a naphthyl group are more preferable.

Specific examples of the substituted aryl group which is preferable as $R_1$, $R_2$ and $R_3$ include aryl groups having a monovalent non-metallic atomic group other than a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenyl-carbamoyloxyphenyl group, an acetylaminophenyl group, an N-methyl-benzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropyl-sulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group and a 3-butynylphenyl group.

Next, A in the general formula (V) will be described. A represents an aromatic cyclic group or a heterocyclic group which may have a substituent. Specific examples of the aromatic cyclic group or heterocyclic group which may have a substituent include those described with respect to $R_1$, $R_2$ and $R_3$ in the general formula (V).

The sensitizing dye represented by the general formula (V) is obtained by a condensation reaction of the above-described acidic nucleus or an active methyl group-containing acidic nucleus with a substituted or unsubstituted aromatic ring or hetero ring. These dyes can be synthesized by referring to JP-B-59-28329.

Next, preferable specific examples (D1) to (D41) of the compound represented by the general formula (V) will be presented. In the case where isomers with respect to a double bond connecting an acidic nucleus and a basic nucleus are present in each of the compounds, the invention should not be construed as being limited to any one of the isomers.

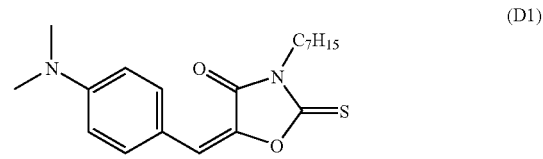

(D1)

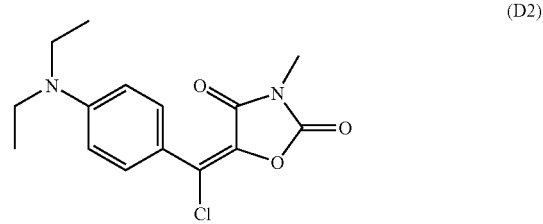

(D2)

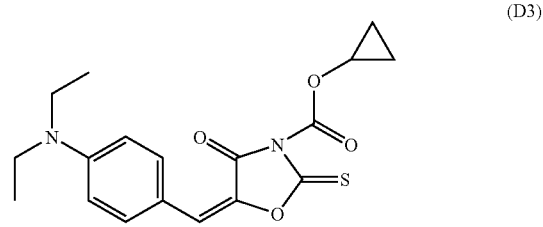

(D3)

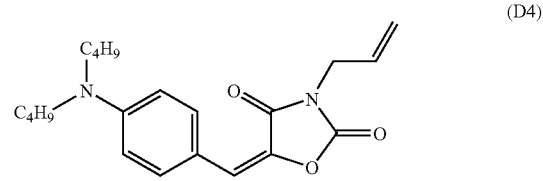

(D4)

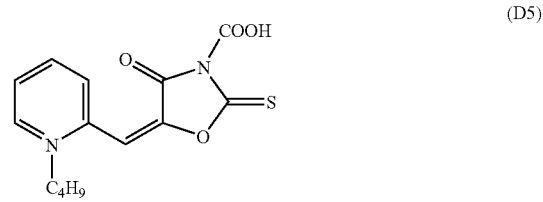

(D5)

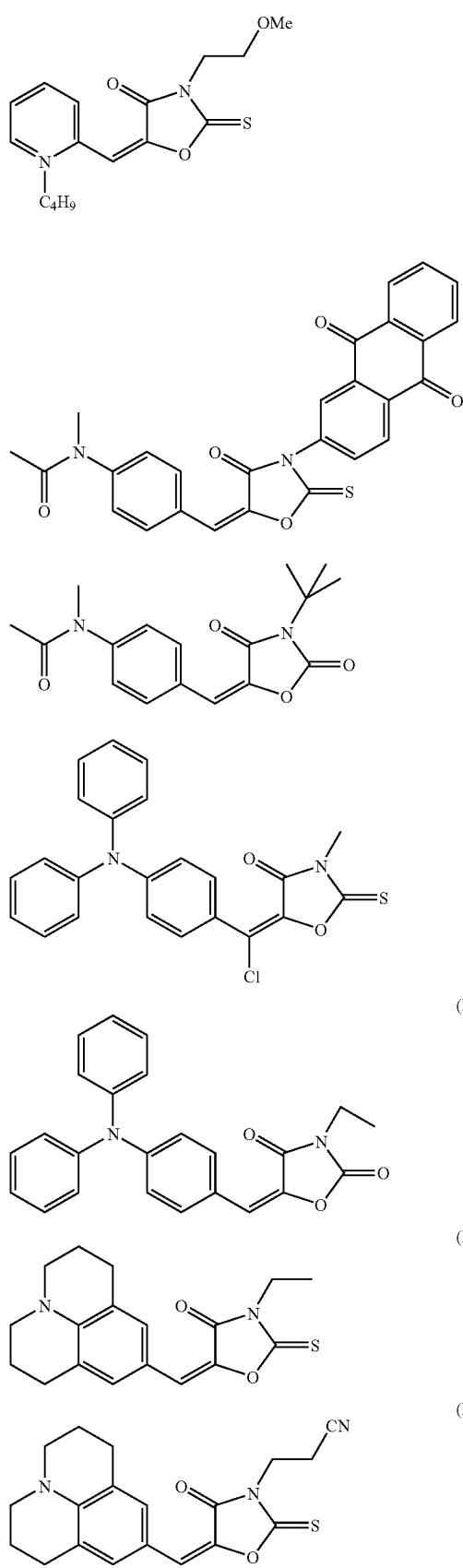
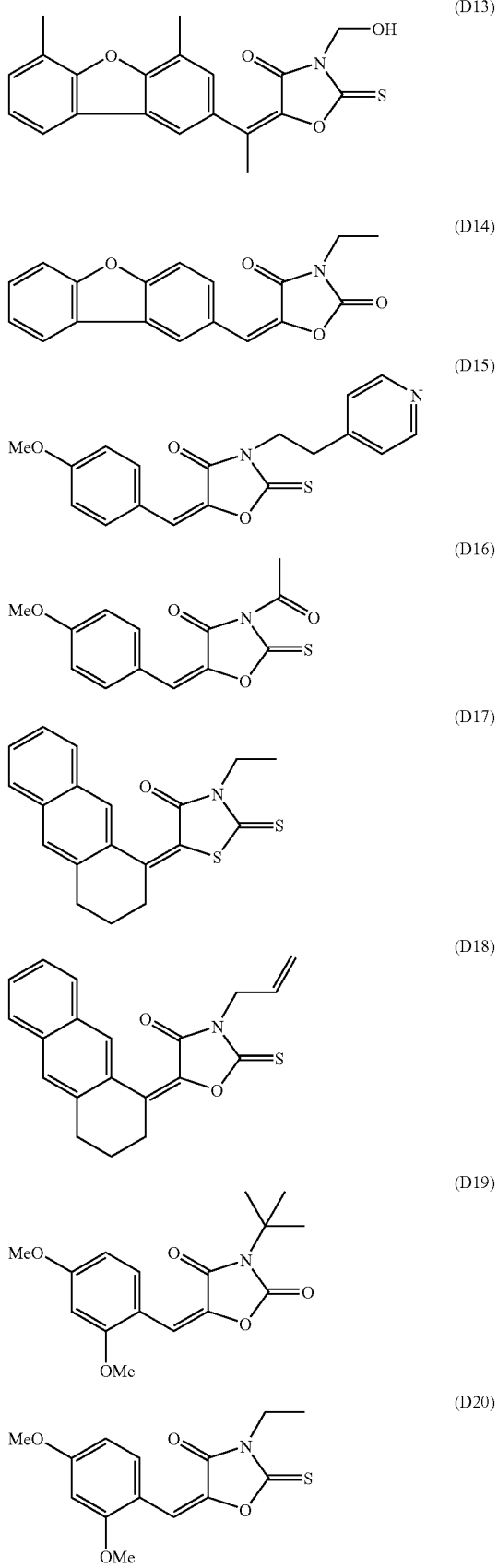

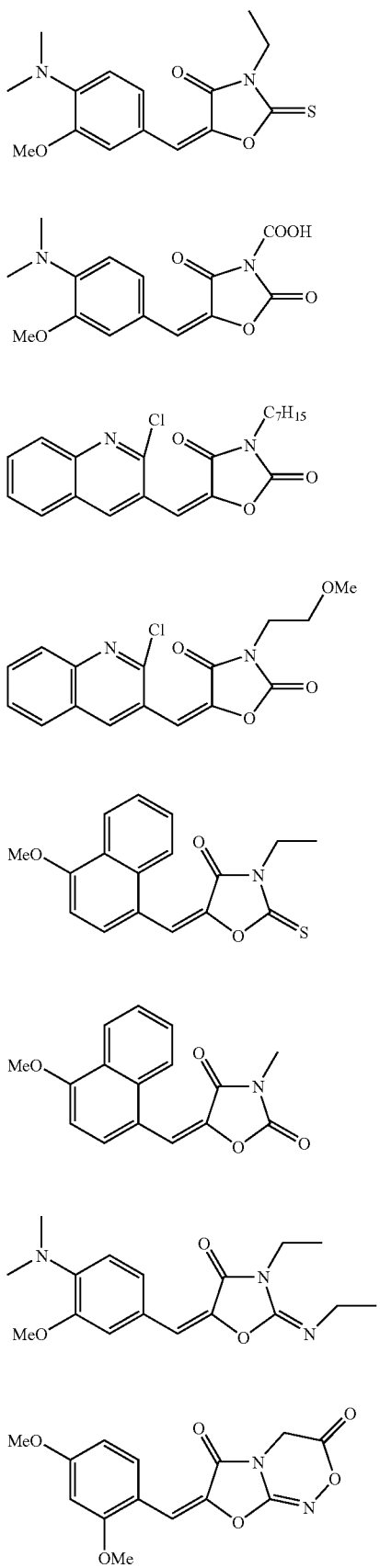
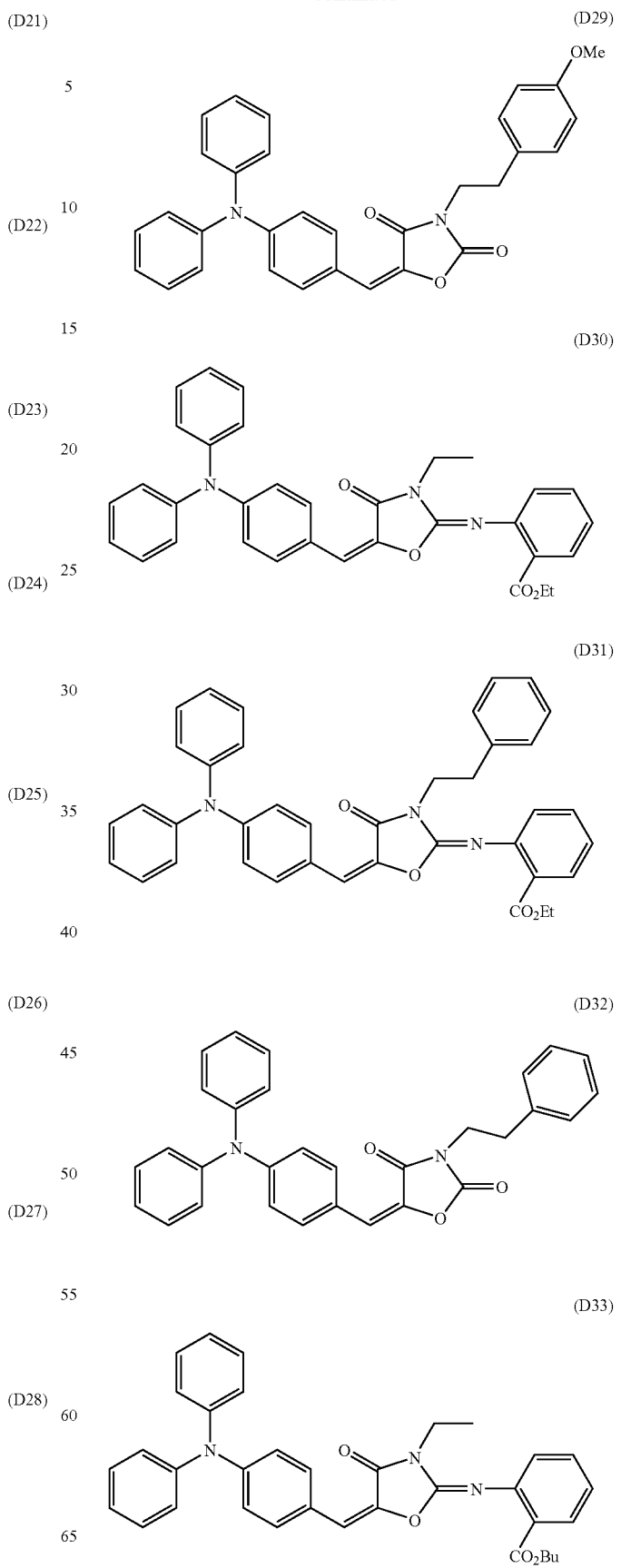

-continued (D34)

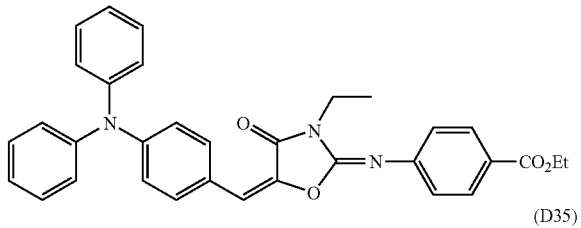

(D35)

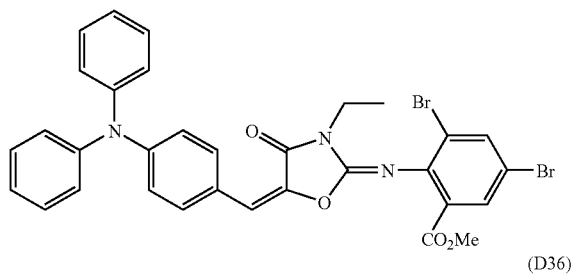

(D36)

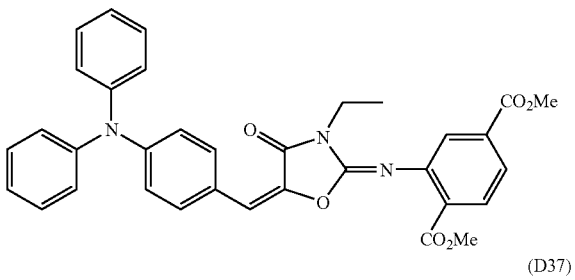

(D37)

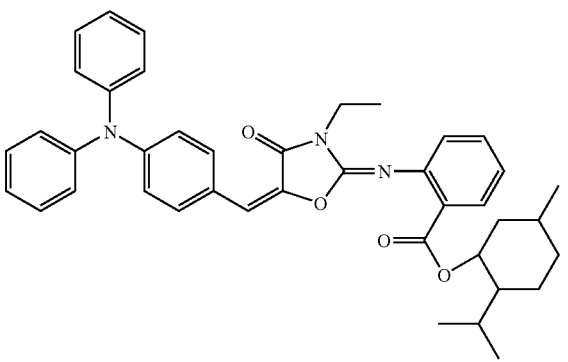

(D38)

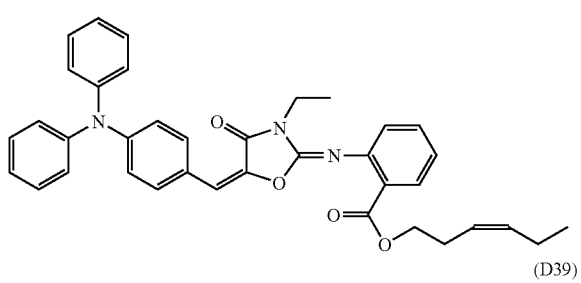

(D39)

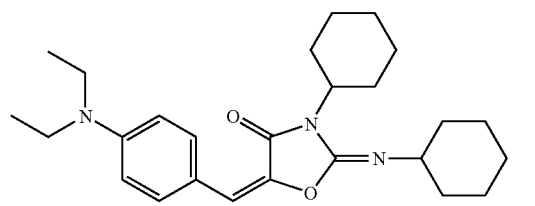

-continued (D40)

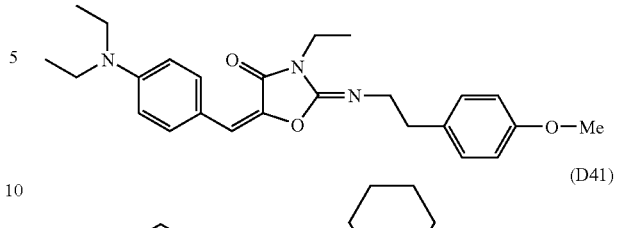

(D41)

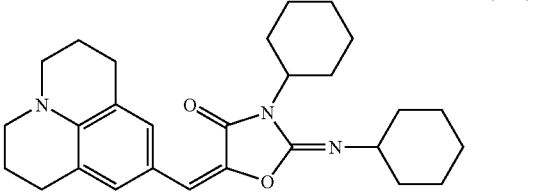

It is preferable that the sensitizing dye absorbing light of from 350 nm to 450 nm is used in an amount of from 1.0 to 10.0% by mass, more preferably from 1.5 to 5.0% by mass, based on the total photosensitive composition.

(B) Polymerization Initiator

The polymerization initiator to be used in the present invention is a compound which generates a radical when exposed to either one or both of light and heat energies and thus initiates or accelerates polymerization of a compound having a polymerizable unsaturated group. As this radical generator, it is possible to select and use an appropriate compound from among known polymerization initiators and compounds having a bond with a small bond-dissociation energy.

Examples of the radical generator as described above include organohalogen compounds, carbonyl compounds, organic peroxides, azo-based polymerization initiators, azide compounds, metallocene compounds, hexaarylbiimidazole compounds, organoboron compounds, disulfone compounds, oxime ester compounds and onium salt compounds.

Specific examples of the organohalogen compound include the compounds described in Wakabayashi et al., *Bull. Chem. Soc. Japan,* 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339, and M. P. Hutt, *Journal of Heterocyclic Chemistry,* 1, No. 3 (1970). Among these compounds, oxazole compounds substituted with a trihalomethyl group and s-triazine compounds are preferred.

More preferred are s-triazine derivatives wherein at least one mono-, di- or trihalogenated methyl group is bonded to the s-triazine ring and oxadiazole derivatives wherein at least one mono-, di- or trihalogenated methyl group is bonded to the oxadiazole ring. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis (trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine and 2-methoxy-4,6-bis(tribromomethyl)-s-triazine.
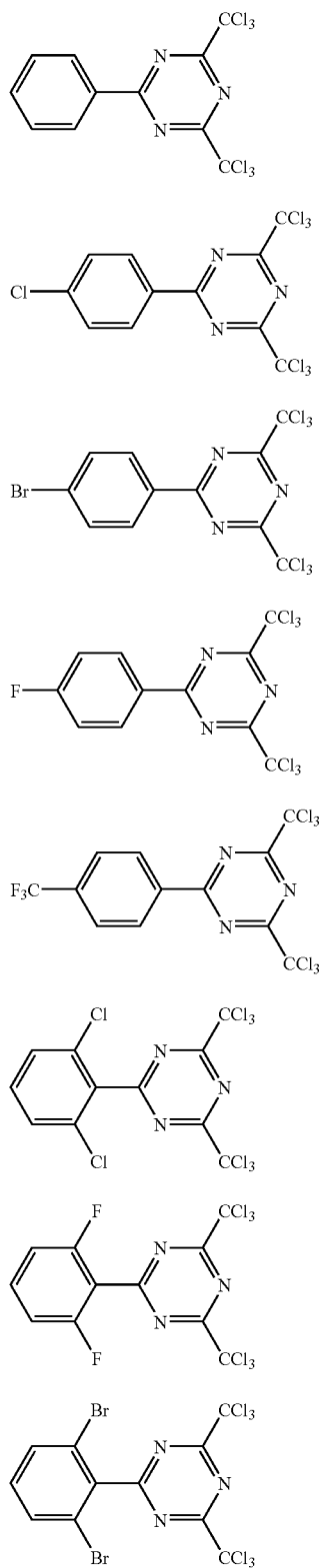
-continued
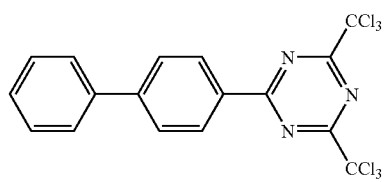
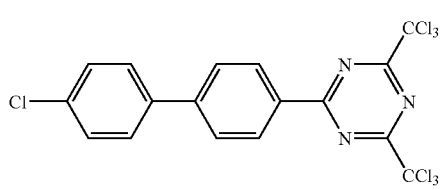
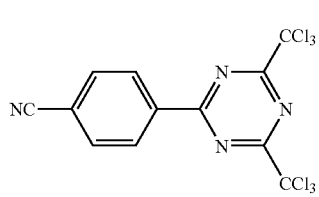
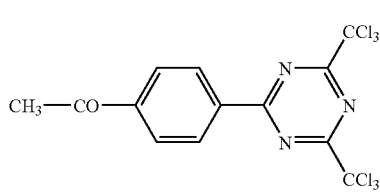
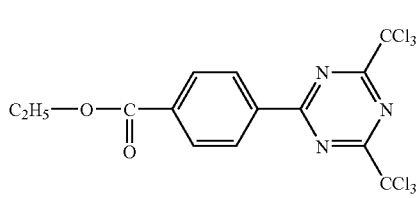
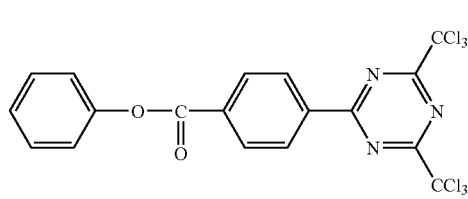
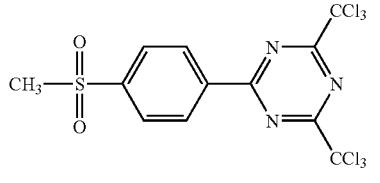
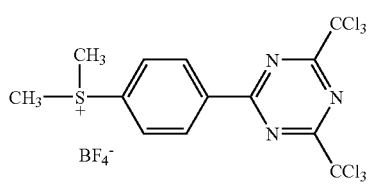

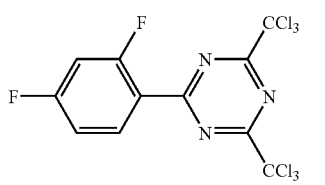
(I)-17

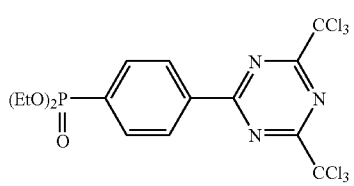
(I)-18

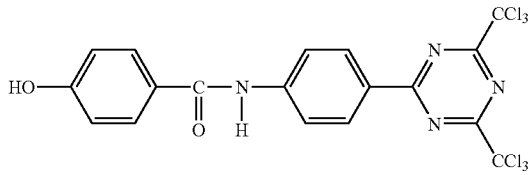
(I)-19

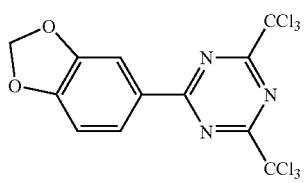
(I)-20

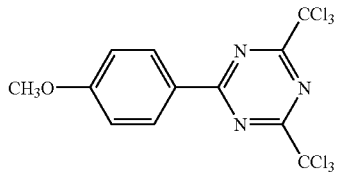
(I)-21

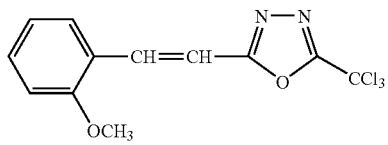
(I)-22

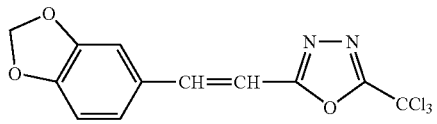
(I)-23

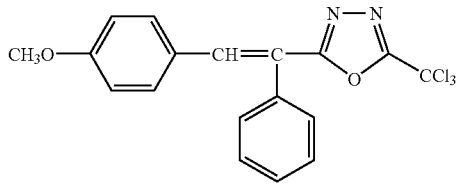
(I)-24

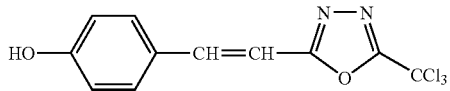
(I)-25

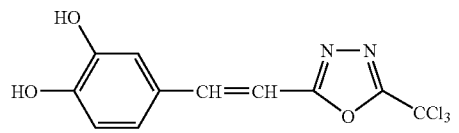
(I)-26

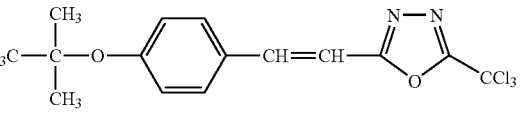
(I)-27

Examples of the above-described carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl)ketone, 1-hydroxy-1-p-odecylphenyl)ketone, 2-methyl-(4'-(methylthio)phenyl)-2-morpholino-1-propanone and 1,1,1-trichloromethyl-(p-butylphenyl)ketone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone and 2,4-diisopropylthioxanthone; and benzoic acid ester derivatives such as ethyl p-dimethylaminobenzoate and ethyl p-diethylaminobenzoate.

As the above-described azo-based compound, use can be made of, for example, azo compounds described in JP-A-8-108621.

Examples of the above-described organic peroxide include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxydicarbonate, di-2-ethylhexylperoxydicarbonate, di-2-ethoxyethylperoxydicarbonate, dimethoxyisopropylperoxycarbonate, di(3-methyl-3-methoxybutyl)peroxydicarbonate, tert-butylperoxyacetate, tert-butylperoxypivalate, tert-butylperoxyneodecanoate, tert-butylperoxyoctanoate, tert-butylperoxylaurate, tert-carbonate, 3,3',4,4'-tetra(t-butylperoxycarbonyl)benzophenone, 3,3',4,4'-tetra(t-hexylperoxycarbonyl)benzophenone, 3,3',4,4'-tetra(p-isopropylcumylperoxycarbonyl)benzophenone, carbonyl di(t-butylperoxydihydrogendiphthalate) and carbonyl di(t-hexylperoxydihydrogendiphthalate).

Examples of the above-described metallocene compound include various titanocene compounds described in JP-A-59-152396, JP-A-61-151197, JP-A-63-41484, JP-A-2-249, JP-A-2-4705 and JP-A-5-83588, such as dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, bis(cyclopentadienyl)-bis(2,6-difluoro-3-(pyl-1-yl)phenyl)titanium and iron-allene complexes described in JP-A-1-304453 and JP-A-1-152109.

Examples of the above-described hexaarylbiimidazole compound include various compounds described in JP-B-6-29285 and U.S. Pat. Nos. 3,479,185, 4,311,783 and 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2-bis(o-methylphenyl)-4,4',5,5'-tetraphenylbiimidazole and 2,2'-bis (o-trifluorophenyl)-4,4',5,5'-tetraphenylbiimidazole.

Examples of the above-described organoboron compound include organic borates described in JP-A-62-143044, JP-A-62-150242, JP-A-9-188685, JP-A-9-188686, JP-A-9-188710, JP-A-2000-131837, JP-A-2002-107916, Japanese Patent No. 2764769, JP-A-2002-116539, and Kunz, Martin, Rad Tech. '98. Proceeding, Apr. 19 to 22, 1998, Chicago; organic boron sulfonium complexes and organic boron oxosulfonium complexes described in JP-A-6-157623, JP-A-6-175564 and JP-A-6-175561; organic boron iodonium complexes described in JP-A-6-175554 and JP-A-6-175553; organic boron phosphonium complexes described in JP-A-9-188710; and organic boron transition metal coordination complexes described in JP-A-6-348011, JP-A-7-128785, JP-A-7-140589, JP-A-7-306527 and JP-A-7-292014.

Examples of the above-described disulfone compound include compounds described in JP-A-61-166544 and JP-A-2003-328465.

Examples of the above-described oxime ester compound include the compounds described in J. C. S. Perkin II, 1653 to 1660 (1979), J. C. S. Perkin II, 156 to 162 (1979), *Journal of Photopolymer Science and Technology*, 202 to 232 (1995), JP-A-2000-66385 and JP-A-2000-80068. Specific examples thereof include the compounds represented by the following structural formulae.

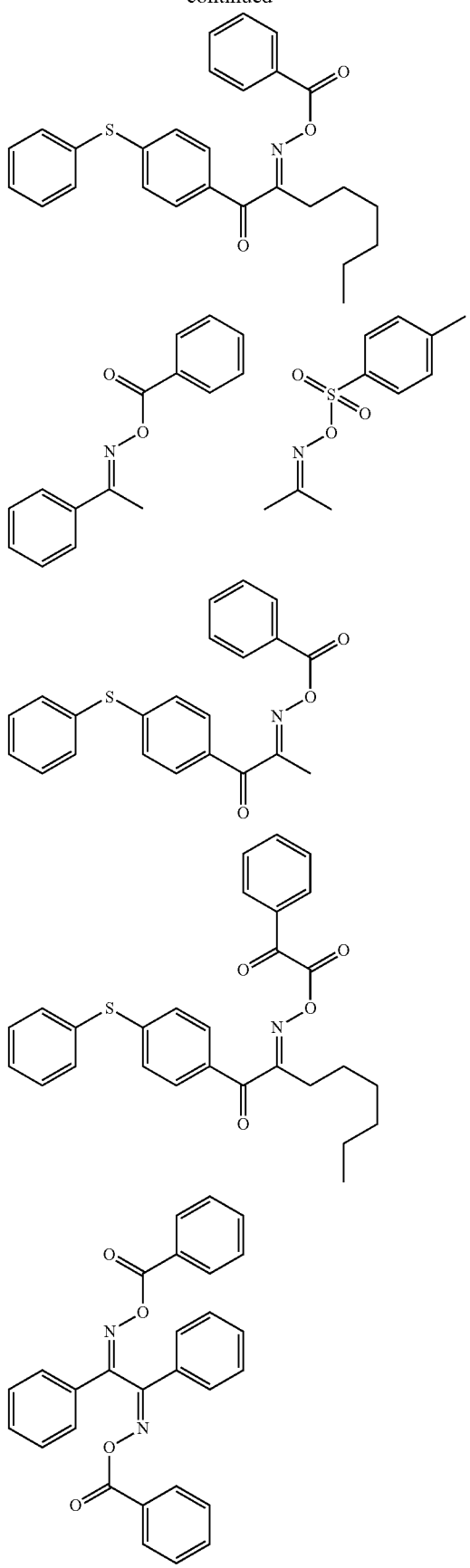

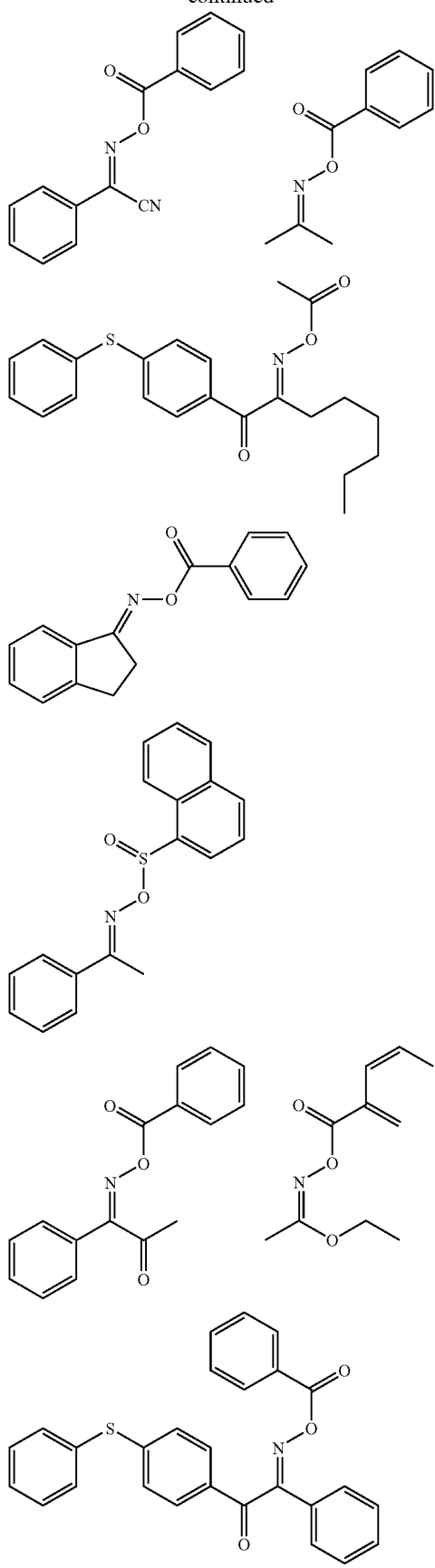
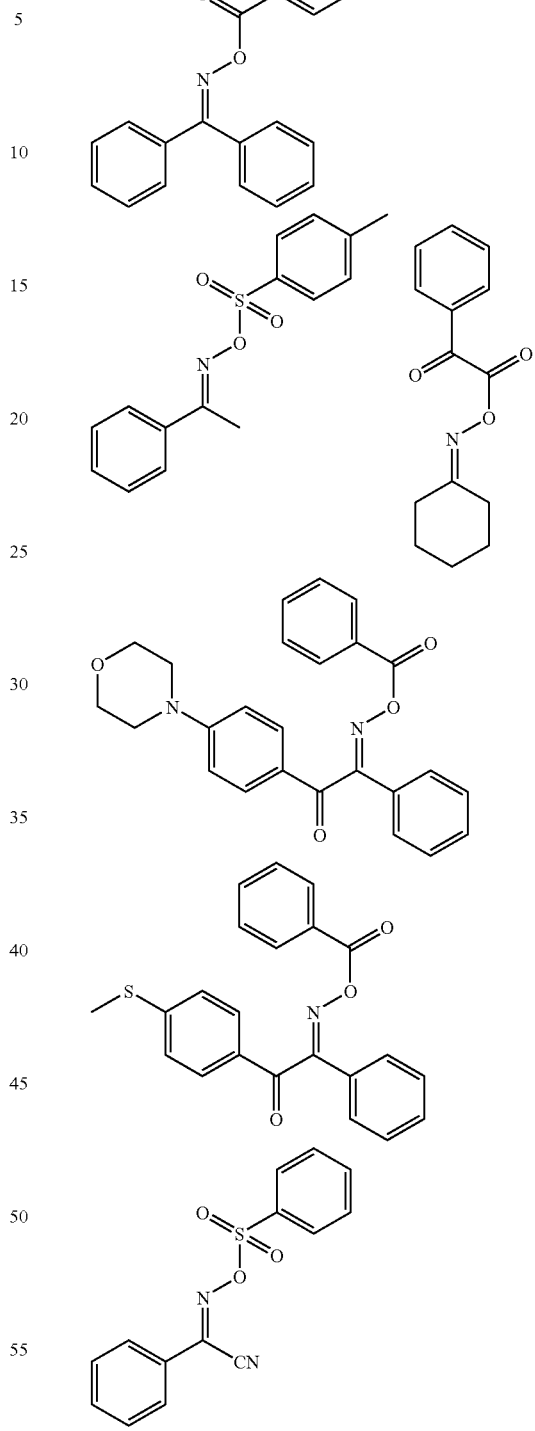
Examples of the above-described onium salt compound include onium salts such as diazonium salts described in S. I. Schlesinger, *Photogr. Sci. Eng.*, 18, 387 (1974) and T. S. Bal et al., *Polymer*, 21, 423 (1980); ammonium salts described in U.S. Pat. No. 4,069,055 and JP-A-4-365049; phosphonium salts described in U.S. Pat. Nos. 4,069,055 and 4,069,056; iodonium salts described in EPs 104,143, U.S. Pat. Nos. 339,049 and 410,201, JP-A-2-150848 and JP-A-2-296514;

sulfonium salts described in EP 370,693, 390,214, 233,567, 297,443 and 297,442, U.S. Pat. No. 4,933,377, 161,811, 410, 201, 339,049, U.S. Pat. Nos. 4,760,013, 4,734,444 and 2,833, 827, and German Patents 2,904,626, 3,604,580 and 3,604, 581; selenonium salts described in J. V. Crivello et al., *Macromolecules*, 10 (6), 1307 (1977) and J. V. Crivello et al., *J. Polymer Sci.*, Polymer Chem. Ed., 17, 1047 (1979); and arsonium salts described in C. S. Wen et al., *Teh. Proc. Conf. Rad. Curing ASIA*, p. 478 (Tokyo, October 1988).

In the invention, such an onium salt acts not as an acid generator but as an ionic radical generator.

Examples of the onium salt suitably used in the invention is an onium salt represented by any one of the following general formulae (RI-I) to (RI-III).

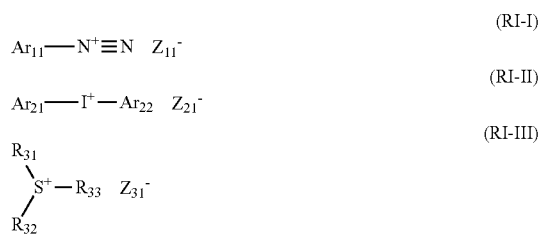

In the formula (RI-I), $Ar_{11}$ represents an aryl group having 20 or less carbon atoms, which may have from 1 to 6 substituent(s), and preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamide or arylamide group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{11}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion, sulfinate ion and sulfate ion are preferable in view of stability. From the viewpoint of safety, perchlorate ion, hexafluorophosphate ion, tetrafluoroborate ion, sulfonate ion and sulfinate ion are particularly preferable.

In the formula (RI-II), $Ar_{21}$ and $Ar_{22}$ each independently represents an aryl group having 20 or less carbon atoms, which may have from 1 to 6 substituent(s), and preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{21}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion, sulfinate ion and carboxylate ion are preferable in view of stability and reactivity.

In the formula (RI-III), $R_{31}$, $R_{32}$ and $R_{33}$ each independently represents an aryl, alkyl, alkenyl or alkynyl group having 20 or less carbon atoms, which may have from 1 to 6 substituent(s), and in view of reactivity and stability, preferably an aryl group. Examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{31}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion, sulfinate ion and carboxylate ion are preferable in view of stability and reactivity. As more preferable examples thereof, there can be enumerated carboxylate ion described in JP-A-2001-343742, and still more preferred is carboxylate ion described in JP-A-2002-148790.

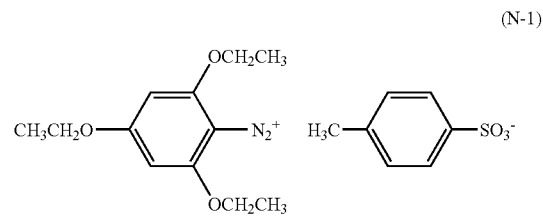

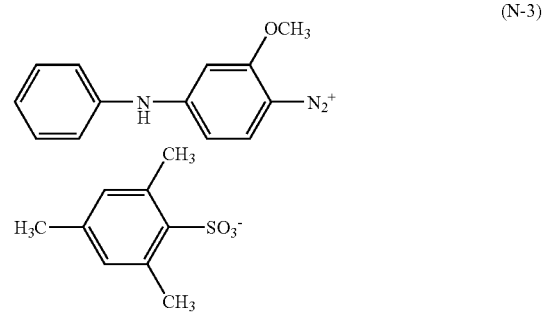

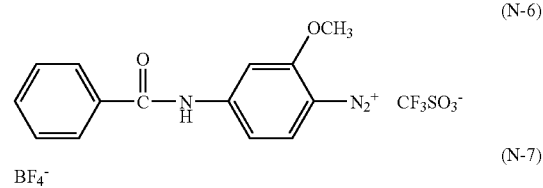

-continued
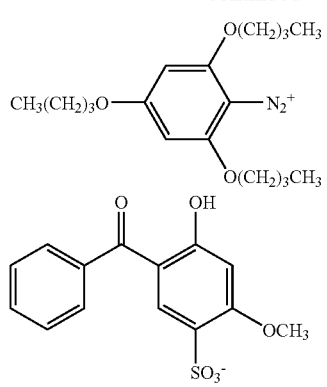
ClO$_4^-$
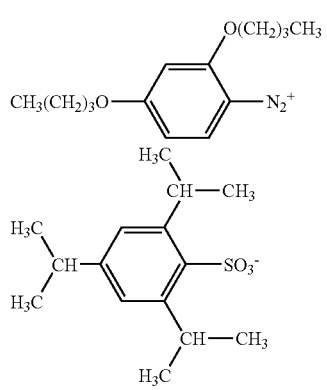
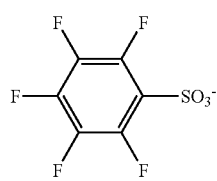
PF$_6^-$
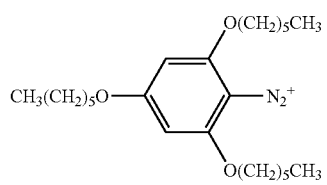
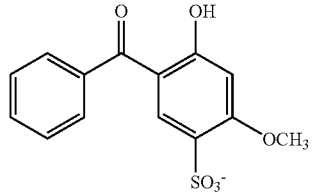
ClO$_4^-$
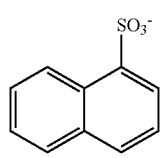
PF$_6^-$
-continued
(N-17)
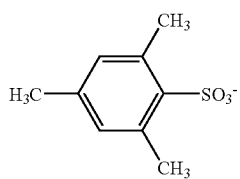
(I-1)
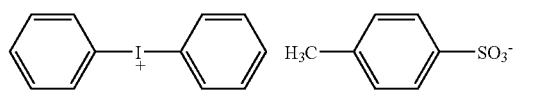
(I-2)
PF$_6^-$
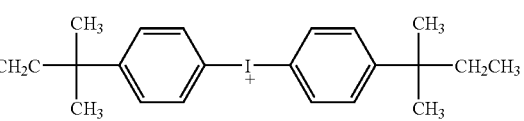
(I-3)
PF$_6^-$
(I-4)
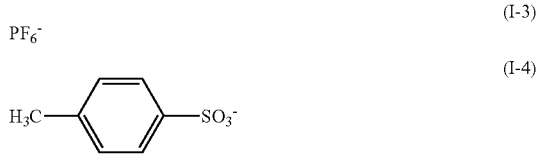
(I-5)
ClO$_4^-$
(I-6)
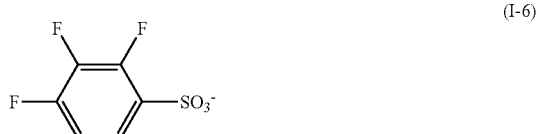
(I-7)
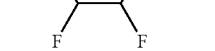
(I-8)
CF$_3$SO$_3^-$
(I-9)
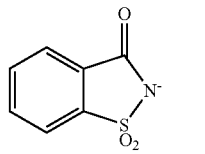
(I-10)
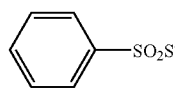
(I-11)
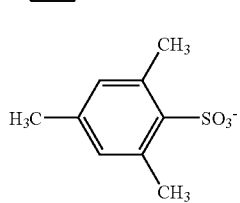

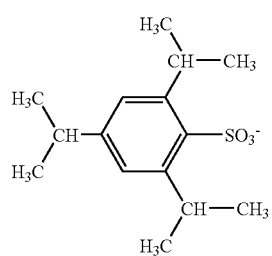
(I-12)
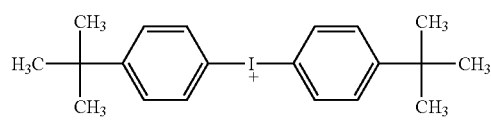
(I-13)
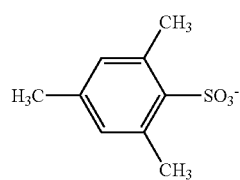
ClO$_4^-$ (I-14)
PF$_6^-$ (I-15)
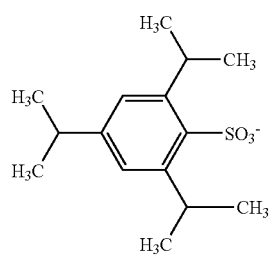
(I-16)
CF$_3$COO$^-$ (I-17)
CF$_3$SO$_3^-$ (I-18)
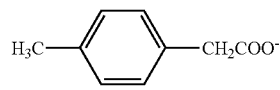
(I-19)
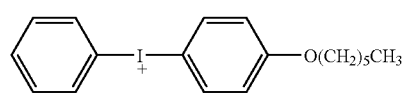
(I-20)
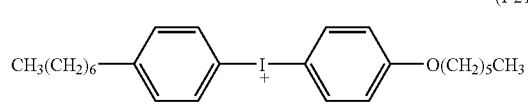
(I-21)
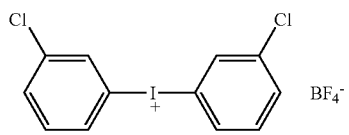
(I-22)
(I-23)
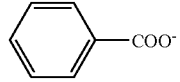
(I-18)
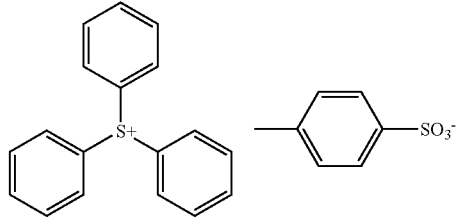
(S-1)
PF$_6^-$ (S-2)
ClO$_4^-$ (S-3)
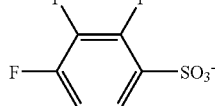
(S-4)
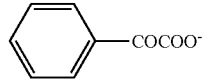
(S-5)
CF$_3$SO$_3^-$ (S-6)
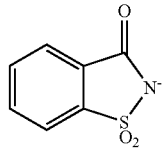
(S-7)
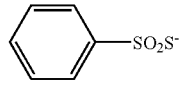
(S-8)
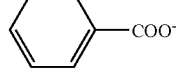
(S-9)
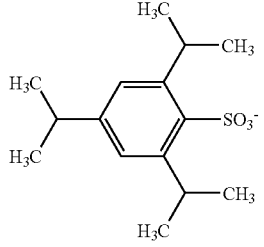
(S-10)

-continued (S-11) 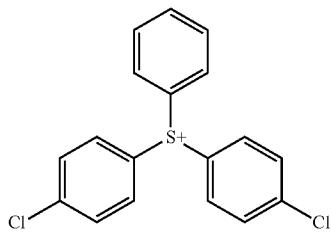

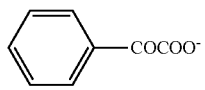

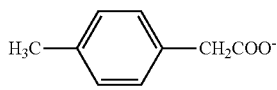

(S-12)

(S-13) 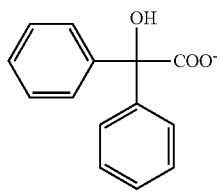

(S-14) 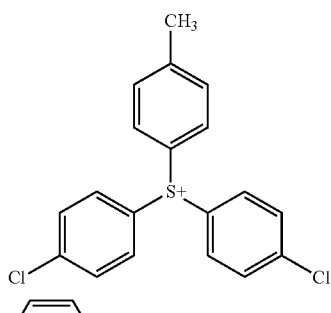

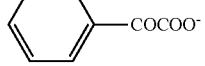

(S-15) 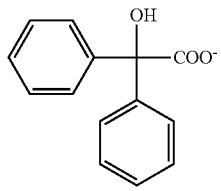

(S-16)

(S-17)

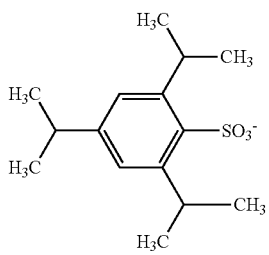

-continued (S-18) 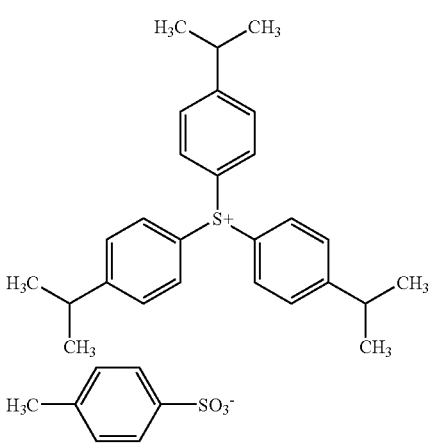

Although the polymerization initiator is not limited to those described above, it is more preferable from the viewpoints of reactivity and stability to use a triazine-base initiator, an organohalogen compound, an oxime ester compound, a diazonium salt, an iodonium salt or a sulfonium salt.

Either one of these polymerization initiators or a combination of two or more of the same may be used. These polymerization initiators may be added to a single layer together with other components. Alternatively, a separate layer may be formed for adding them. The polymerization initiator may be added in an amount of preferably from 0.1 to 50% by mass, more preferably from 0.5 to 30% by mass and particularly preferably from 0.8 to 20% by mass based on the total solid components constituting the photosensitive layer.

(C) Polymerizable Compound

The polymerizable compound which can be used in the photosensitive layer in the present invention is an addition-polymerizable compound having at least one ethylenically unsaturated double bond and is selected from compounds having at least one, preferably two or more, terminal ethylenically unsaturated bond(s). Such compounds are widely known in this industrial field and these known compounds can be used in the present invention without any particular limitation. These compounds occurs in a chemical mode such as a monomer, a prepolymer (that is, a dimer, a trimer or an oligomer) or a mixture or copolymer thereof. Examples of the monomer and its copolymer include unsaturated carboxylic acids (for example, acrylic acid, methacrylic acid, itaconic acid, crotonic acid, isocrotonic acid, maleic acid), and esters and amides thereof. Among these compounds, esters of an unsaturated carboxylic acid with an aliphatic polyhydric alcohol compound, and amides of an unsaturated carboxylic acid with an aliphatic polyvalent amine compound are preferable. Also, use may be preferably made of addition reaction products of an unsaturated carboxylic acid ester or amide having a nucleophilic substituent such as a hydroxyl group, an amino group or a mercapto group with a monofunctional or polyfunctional isocyanate or epoxy, and dehydrating condensation reaction products with a monofunctional or polyfunctional carboxylic acid. Furthermore, it is possible to use addition reaction products of an unsaturated carboxylic acid ester or amide having an electrophilic substituent such as an isocyanate group or an epoxy group with a monofunctional or polyfunctional alcohol, an amine or a thiol, and displacement reaction products of an unsaturated carboxylic acid ester or amide having a leaving substituent such as halogen group or tosyloxy group with a monofunctional or polyfunctional alcohol, an amine or a thiol. Alternatively, use can be made of compounds where the unsaturated carboxylic acid of the above-described compounds is replaced by an unsaturated phosphonic acid, styrene, vinyl ether or the like.

Specific examples of the ester monomer of an aliphatic polyhydric alcohol compound with an unsaturated carboxylic acid are as follows. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, ethylene oxide (EO)-denatured triacrylate isocyanurate, a polyester acrylate oligomer.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

As other examples of the ester, use can be appropriately made of aliphatic alcohol-based esters described in JP-B-51-47334 and JP-A-57-196231, those having an aromatic skeleton described in JP-A-59-5240, JP-A-59-5241 and JP-A-2-226149, and those containing an amino group described in JP-A-1-165613. These ester monomers may also be used as a mixture.

Specific examples of the amide monomer of an aliphatic polyvalent amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide. Other preferred examples of the amide-type monomer include those having a cyclohexylene structure described in JP-B-54-21726.

Moreover, a urethane-based addition-polymerizable compound produced by using an addition reaction of an isocyanate with a hydroxyl group is also preferred and specific examples thereof include vinyl urethane compounds having two or more polymerizable vinyl groups per molecule as described in JP-B-48-41708, which are obtained by adding a vinyl monomer having a hydroxyl group represented by the following general formula (A) to a polyisocyanate compound having two or more isocyanate groups per molecule, $$CH_2=C(R_4)COOCH_2CH(R_5)OH \qquad (A)$$

wherein $R_4$ and $R_5$ each represents H or $CH_3$.

Also, urethane acrylates described in JP-A-51-37193, JP-B-2-32293 and JP-B-2-16765, and urethane compounds having an ethylene oxide-type skeleton as described in JP-B-58-49860, JP-13-56-17654, JP-B-62-39417 and JP-B-62-39418 are suitably used. By using addition-polymerizable compounds having an amino or sulfide structure in the molecule as described in JP-A-63-277653, JP-A-63-260909 and JP-A-1-105238, furthermore, a photopolymerizable composition having very excellent photosensitization speed can be obtained.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth)acrylic acid. In addition, specific unsaturated compounds described in JP-B-46-43946, JP-B-1-40337 and JP-B-1-40336, and vinyl phosphonic acid-based compounds described in JP-A-2-25493 may be used. In some cases, use can be appropriately made of structures containing a perfluoroalkyl group described in JP-A-61-22048. Furthermore, those presented in *Nippon Setchaku Kyokai-shi*, Vol. 20, No. 7, p. 300 to 308 (1984) as a photocurable monomer or oligomer are also usable.

Details of the method of using these polymerizable compounds, such as structure, sole or combination use and amount added, can be freely selected in accordance with the designed performance of the final lithographic printing plate precursor and, for example, may be selected from the following standpoints.

From the viewpoint of sensitivity, a structure having a larger unsaturated group content per molecule is preferred and in most cases, a bifunctional or higher polyfunctional compound is preferred. To elevate the strength of an image area, namely, the hardened layer, a trifunctional or higher polyfunctional compound is preferred. It is also effective to employ a method of controlling both sensitivity and strength by using a combination of compounds differing in the functional number or in the polymerizable group (for example, an acrylic acid ester, a methacrylic acid ester, a styrene-based compound or a vinyl ether-based compound).

The selection and use method of the addition-polymerizable compound are important factors also for the compatibility and dispersibility with other components (for example, a binder polymer, a polymerization initiator and a colorant) in the photosensitive layer. For example, the compatibility may be improved in some cases by using a low purity compound or using two or more compounds in combination. Also, a specific structure may be selected for the purpose of improving the adhesion to the support, the protective layer as will be described later, or the like.

The polymerizable compound is preferably used in an amount of 5 to 80% by mass, more preferably from 25 to 75% by mass, based on the total solid components in the photosensitive layer. Also, these polymerizable compounds may be used either alone or in combination of two or more thereof. In addition, the use method of the polymerizable compound can be freely selected by taking account of the degree of polymerization inhibition due to oxygen, resolution, fogging, change in refractive index, surface tackiness and the like. It is also possible in some cases to employ a layer structure or coating method such as undercoating and overcoating.

(D) Binder Polymer

The binder polymer to be used in the invention is a binder polymer having a graft chain wherein the graft chain is a hydrophilic graft chain having a hydrophilic group.

Moreover, it is preferable that the binder polymer to be used in the invention is substantially free from any acid group such as a carboxyl group, a sulfone group or a phosphate group and the acid value of the binder polymer (the acid content per gram of the polymer expressed in chemical equivalency) is 0.3 meq/g or less, more preferably 0.1 meq/g or less.

A hydrophilic graft chain is a chain which has a hydrophilic group to impart developability with water or an aqueous developing solution. Since it is preferable that the binder polymer is free from acid group as discussed above, a hydrophilic group other than an acid group is preferably employed as the hydrophilic group. Preferable examples of the hydrophilic group include a hydroxyl group; an amino group; an ether group; an amide group; a salt obtained by neutralizing a carboxylic acid, sulfonic acid or phosphoric acid; an ammonium salt.

From the viewpoint of synthesis, it is preferable that the above-described hydrophilic group is located in a side chain of the graft chain skeleton while the ether bond is located in the main chain.

The term "graft chain" as used in the invention means a polymer side chain having a molecular weight of at least 200.

As the graft chain as described above, graft chains of poly (meth)acrylate, polyvinylacetal, polyurethane, polyamide, polystyrene, polyether or polyester are preferred. In the case where the main chain of the binder polymer is poly(meth)acrylate, it is particularly preferable that the graft chain is poly(meth)acrylate too. In the case where the main chain of the binder polymer is polyurethane, it is particularly preferable that the graft chain is poly(meth)acrylate or polyether.

The molecular weight of the graft chain expressed in mass-average molecular weight is preferably from 500 to 50000, more preferably from 500 to 30000 and particularly preferably from 500 to 15000. The graft chain can contain the hydrophilic group as a hydrophilic group-containing monomer unit in an amount of from 10 to 100% by mol, preferably from 30 to 100% by mol and particularly preferably from 60 to 100% by mol.

It is preferable that the binder polymer to be used in the invention is a polymer which satisfies the requirements as described above and has good film properties.

As such a binder polymer, a polymer having a main chain selected from among an acrylic resin, a polyvinylacetal resin, a polyurethane resin, a polyamide resin, an epoxy resin, a methacrylic resin, a styrene resin or a polyester resin is preferred. Among them, a (meth)acrylic resin or a polyurethane resin is preferable.

The binder polymer according to the invention preferably contains from 0.1 to 20% by mol of the polymerization unit having the graft chain as described above, more preferably from 1 to 10% by mol and particularly preferably from 1 to 5% by mol.

The molecular weight of the binder polymer expressed in mass-average molecular weight is preferably from 2000 to 300000, more preferably from 10000 to 200000 and particularly preferably from 20000 to 150000. Also, the number-average molecular weight thereof is preferably 1000 or more, more preferably from 2000 to 250000. The polydispersity index (mass-average molecular weight/number-average molecular weight) thereof is preferably from 1.1 to 10.

Either a single binder polymer or a mixture of two or more kinds thereof may be used. The content of the binder polymer is from 5 to 90% by mass, preferably from 10 to 70% by mass and more preferably from 10 to 60% by mass, based on the total solid components in the photosensitive layer. Within this range, particularly preferable strength and image-formability can be obtained in an image area.

To improve the film strength in an image area, crosslinkability can be imparted to the main chain and/or a graft chain of the binder polymer.

The binder polymer can be made crosslinkable by introducing an crosslinkable group such as an ethylenically unsaturated bond into the main chain and/or the graft chain of the polymer. The crosslinkable group may be introduced either by copolymerization or a polymer reaction.

The crosslinkable group as used herein means a group capable of crosslinking the binder polymer in the course of the radical polymerization which occurs in the photosensitive layer when the lithographic printing plate precursor is exposed. The crosslinkable group is not particularly restricted so long as having the above function. For example, there can be enumerated a functional group capable of undergoing addition polymerization such as an ethylenically unsaturated bond group, an amino group or an epoxy group. Alternatively, it may be a functional group capable of serving as a radical upon photoirradiation. Examples of a crosslinkable group of this type include a thiol group, a halogen group and an onium salt structure. Among these groups, an ethylenically unsaturated bond group is preferable and functional groups represented by the following general formulae (1) to (3) are particularly preferred.

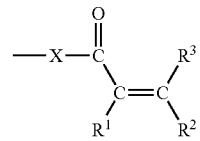

General formula (1)

In the above general formula (1), $R^1$ to $R^3$ each independently represents a monovalent organic group. It is preferable that $R^1$ is a hydrogen atom or an alkyl group which may have a substituent. Among all, a hydrogen atom or a methyl group is preferred because of having a high radical reactivity. $R^2$ and $R^3$ each independently represents a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent. Among all, a hydrogen atom, a carboxyl group, an alkoxycarbonyl group, an alkyl group which may have a substituent or an aryl group which may have a substituent is preferred because of having a high radical reactivity.

X represents an oxygen atom, a sulfur atom or $N(R^{12})$— wherein $R^{12}$ represents a hydrogen atom or a monovalent organic group. For example, $R^{12}$ represents an alkyl group which may have a substituent. Among all, a hydrogen atom, a methyl group, an ethyl group or an isopropyl group is preferred because of having a high radical reactivity.

Examples of the substituent which can be introduced therein include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amide group, an alkylsulfonyl group and an arylsulfonyl group.

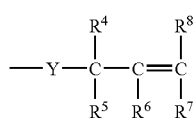

General formula (2)

In the above general formula (2), $R^4$ to $R^8$ each independently represents a monovalent organic group. It is preferable that $R^4$ to $R^8$ each independently represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent. Among all, a hydrogen atom, a carboxyl group, an alkoxycarbonyl group, an alkyl group which may have a substituent or an aryl group which may have a substituent is preferred.

Examples of the substituent which can be introduced therein include the same ones as cited above with respect to the general formula (1). Y represents an oxygen atom, a sulfur atom or $N(R^2)$— wherein $R^{12}$ has the same meaning as $R^{12}$ in the general formula (1) and preferable examples thereof are also the same.

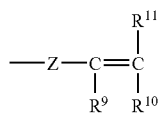

General formula (3)

In the above general formula (3), $R^9$ preferably represents a hydrogen atom or an alkyl group which may have a substituent. Among all, a hydrogen atom or a methyl group is preferred because of having a high radical reactivity. $R^{10}$ and $R^{11}$ each independently represents a hydrogen atom, a halogen atom an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent. Among all, a hydrogen atom, a carboxyl group, an alkoxycarbonyl group, an alkyl group which may have a substituent or an aryl group which may have a substituent is preferred because of having a high radical reactivity.

Examples of the substituent which can be introduced therein include the same ones as cited above with respect to the general formula (1). Z represents an oxygen atom, a sulfur atom, $—N(R^{13})—$ or a phenylene group which may have a substituent. $R^{13}$ represents an alkyl group which may have a substituent. Among all, a methyl group, an ethyl group or an isopropyl group is preferred because of having a high radical reactivity.

Among those described above, a (meth)acrylic copolymer having a crosslinkable group in a side chain and polyurethane are still preferred.

In the crosslinkable binder polymer, for example, a free radical (a polymerization-initiating radical or a development radical in the course of the polymerization of a polymerizable compound) attaches to its crosslinkable functional group. Thus, polymerizable units undergo addition polymerization either directly or via chain polymerization of the polymerizable compound. As a result, a crosslinkage is formed among polymer molecules and the polymer is hardened. Alternatively, an atom in the polymer (for example, a hydrogen atom on a carbon atom adjacent to the functional crosslinkable group) is withdrawn by a free radical and a polymer radical is thus formed. Next, the polymer radicals are bonded together to form a crosslinkage among the polymer molecules, which results in hardening.

The content of the polymerization unit having a crosslinkable group in the graft chain is preferably from 1 to 90% by mol based on the polymerization units constituting the graft chain, more preferably from 3 to 70% by mol and particularly preferably from 5 to 50% by mol.

The content of the crosslinkable group in the main chain of the binder polymer is preferably from 1 to 90% by mol based on the polymerization units constituting the main chain of the binder polymer, more preferably from 3 to 70% by mol and particularly preferably from 5 to 50% by mol.

Next specific examples of the hydrophilic graft unit preferably usable in the invention will be presented, though the invention is not restricted thereto.

Examples of Hydrophilic Graft Unit of (meth)acryl Type

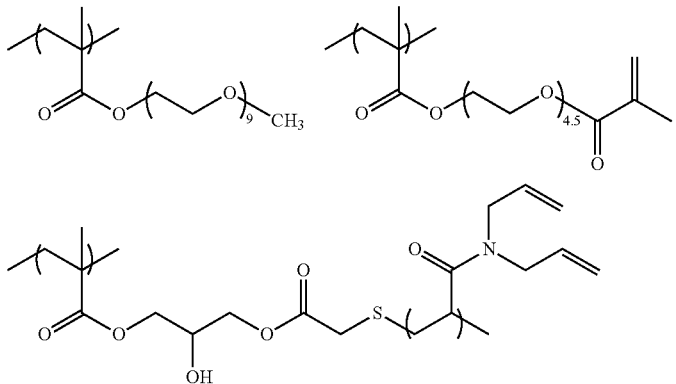

-continued
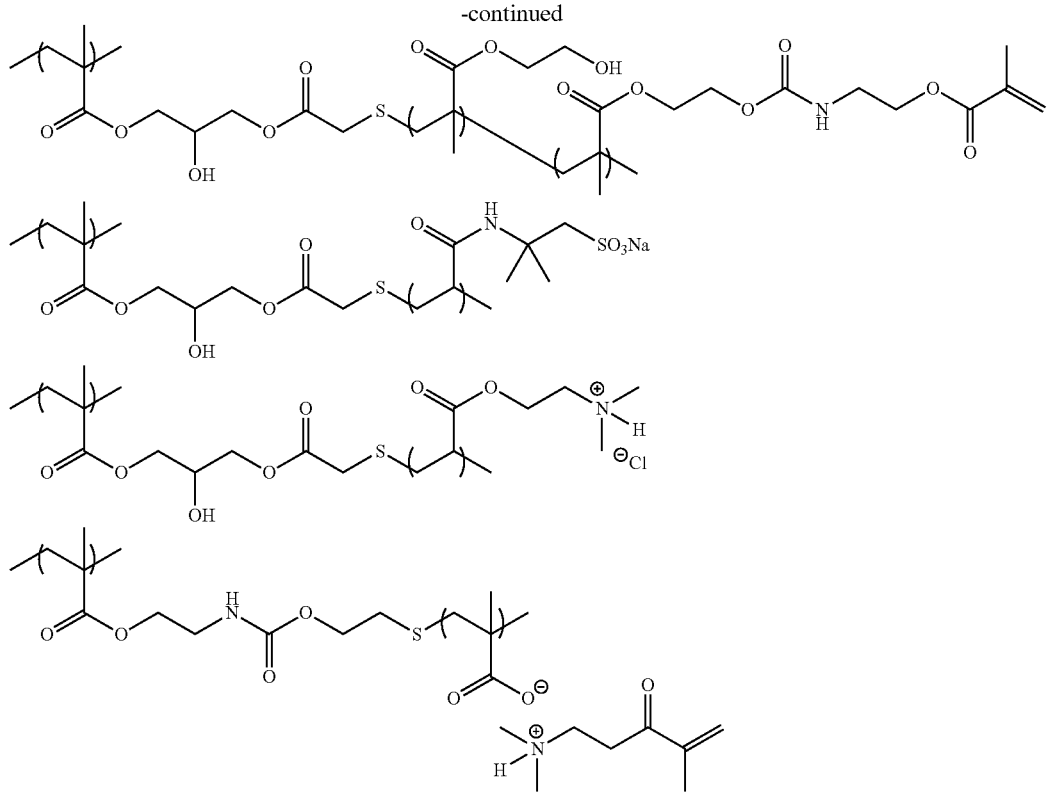
Examples of Hydrophilic Graft Unit of Diol Type
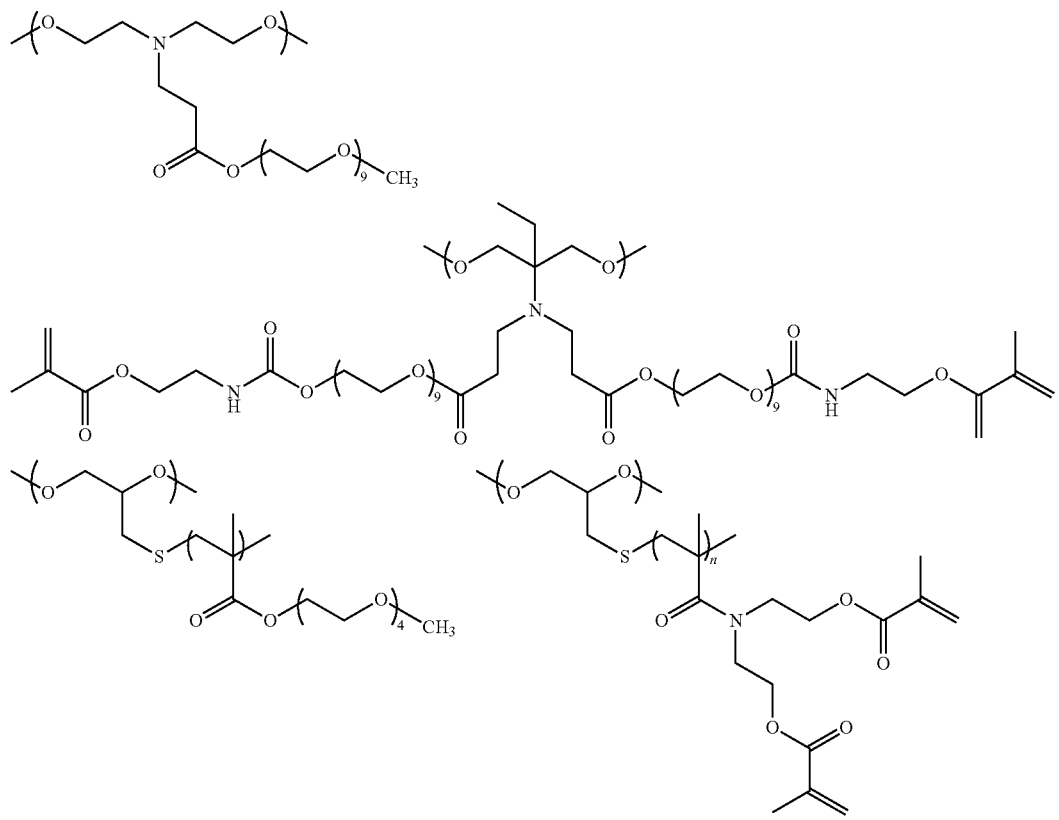

-continued

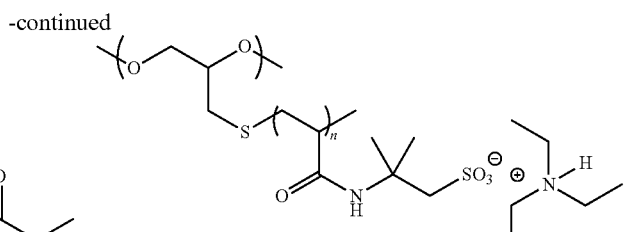

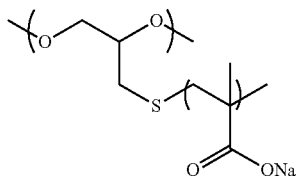

In the above chemical formulae, each numerical symbol shows the number of the repeating units in the graft chain.

Next, examples of the binder polymer in the invention will be presented, though the invention is not restricted thereto. In the following structural formulae, each alphabetical symbol shows a molar ratio while each numerical symbol shows the average of the number of the repeating units in the graft chain. Molecular weight is expressed in mass-average.

| No. | Binder Structure | Composition ratio (mol %) | Graft chain M.W. | Binder M.W. |
|---|---|---|---|---|
| 1 | 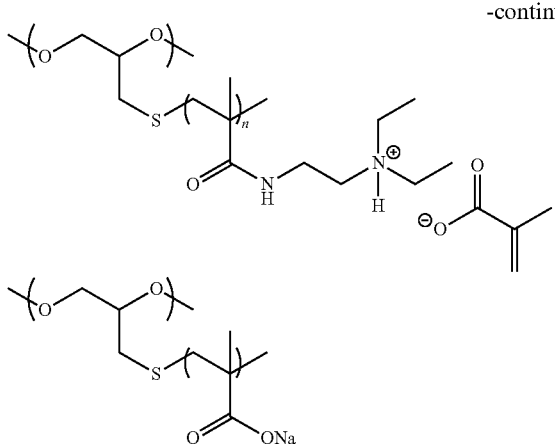 Graft Unit 1 | a = 99. b = 1 | 1000 | 70000 |
| 2 | Graft Unit 2 | a = 99. b = 1 | 2000 | 100000 |
| 3 | | a = 99.5. b = 0.5 | 1000 | 80000 |

-continued

| No. | Binder Structure | Composition ratio (mol %) | Graft chain M.W. | Binder M.W. |
|---|---|---|---|---|
| | Graft Unit 3 | | | |
| 4 | Graft Unit 4 | a = 79, b = 20, c = 1 | 2000 | 90000 |
| 5 | Graft Unit 5 | a = 98, b = 2 | 2000 | 80000 |
| 6 | Graft Unit 6 | a = 98, b = 1 | 2000 | 110000 |

-continued
| No. | Binder Structure | Composition ratio (mol %) | Graft chain M.W. | Binder M.W. |
|---|---|---|---|---|
| 7 | 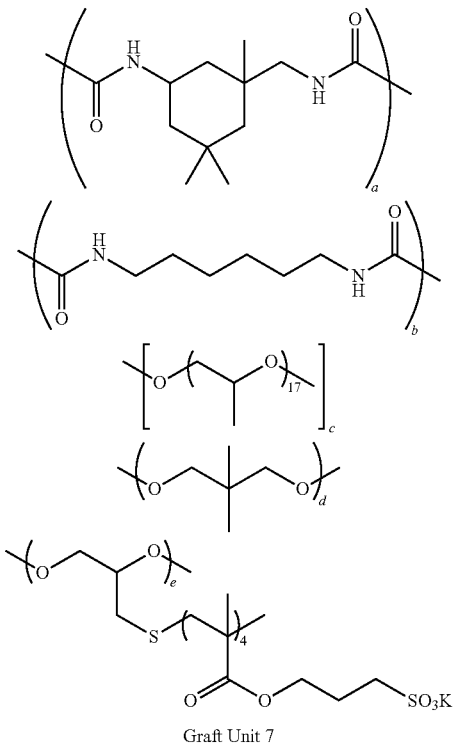 Graft Unit 7 | a = 30, b = 20, c = 24.5, d = 25, e = 0.5 | 1000 | 60000 |
| 8 | 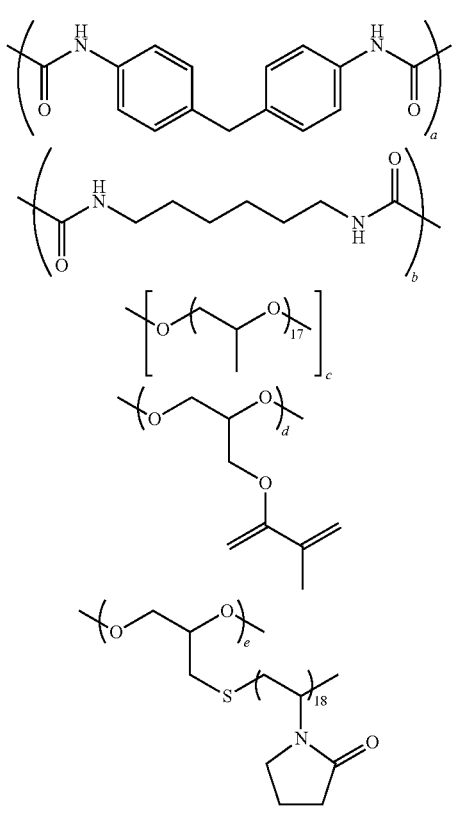 Graft Unit 8 | a = 30, b = 20, c = 20, d = 29, e = 1 | 2000 | 60000 |

| No. | Binder Structure | Composition ratio (mol %) | Graft chain M.W. | Binder M.W. |
|---|---|---|---|---|
| 9 | Graft Unit 9 | a = 50, b = 20, c = 28, d = 2 | 2000 | 50000 |
| 10 | | a = 30, b = 20, c = 20, d = 29, e = 1 | 600 | 50000 |

| No. | Binder Structure | Composition ratio (mol %) | Graft chain M.W. | Binder M.W. |
|---|---|---|---|---|
| 11 | Graft Unit 10 / Graft Unit 11 | a = 30. b = 20. c = 20. d = 29.5. e = 0.5 | 3000 | 70000 |

(E) Chain transfer agent

The photosensitive layer of the invention may contain a chain transfer agent The chain transfer agent contributes to the improvement in sensitivity and storage stability. As a compound serving as the chain transfer agent, use is made of, for example, compounds having SH, PH, SiH or GeI in molecule. Such a compound can donate hydrogen to a low-active radical species to form a radical. Alternatively, it is deprotonized after being oxidized and thus forms a radical.

In the photosensitive layer of the invention, a thiol compound (for example, 2-mercaptobenzimidazole) can be preferably used as a chain transfer agent.

Among them, a thiol compound represented by the following general formula (I) can be particularly appropriately used. By using this thiol compound as a chain transfer agent, the problem of an offensive odor and lowering in sensitivity caused by evaporation from the photosensitive layer or diffusion toward another layer can be avoided. As a result, a lithographic printing plate precursor having a high storage stability, a high sensitivity and a high printing durability can be obtained.

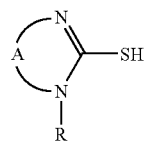

General formula (I)

In the general formula (I), R represents an alkyl group which may have a substituent or an aryl group which may have a substituent. A represents a group forming a 5-membered or 6-membered carbon-containing heterocyclic ring together with the N=C—N moiety. A may have a substituent.

It is more preferable to use a compound represented by the following general formula (IA) or (IB).

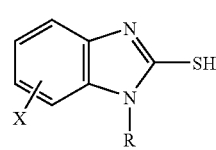

General formula (IA)

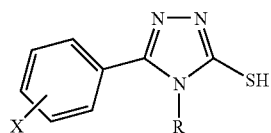

General formula (IB)

In the general formulae (IA) and (IB), R represents an alkyl group which may have a substituent or an aryl group which may have a substituent. X represents a halogen atoms an alkoxyl group, an alkyl group which may have a substituent or an aryl group which may have a substituent.

Next, specific examples of compounds represented by the general formula (I) will be presented, though the invention is not restricted thereto.

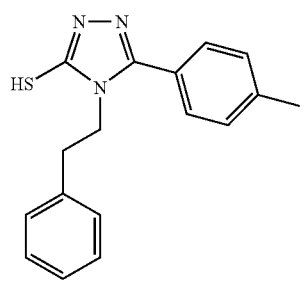

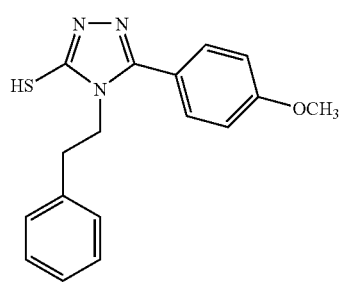

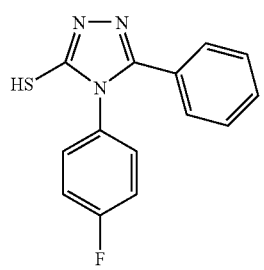

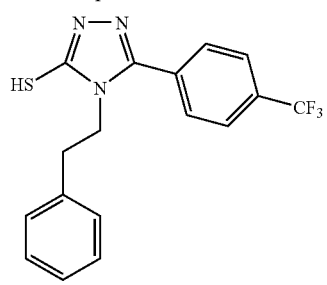

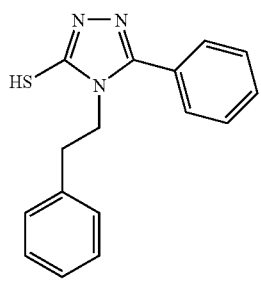

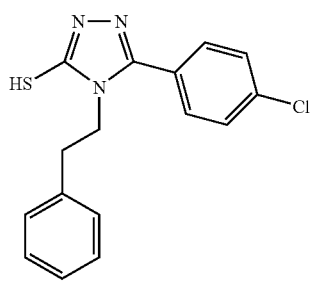

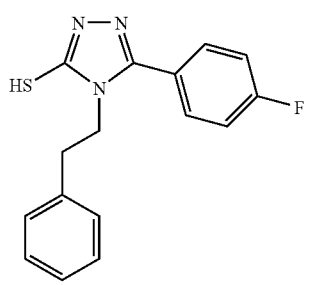

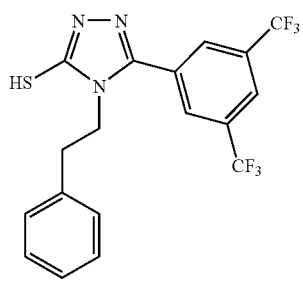

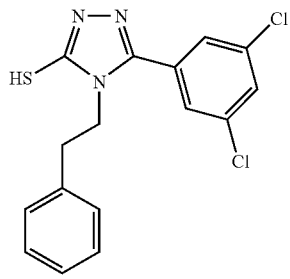

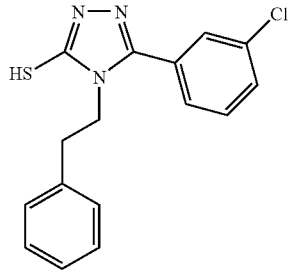

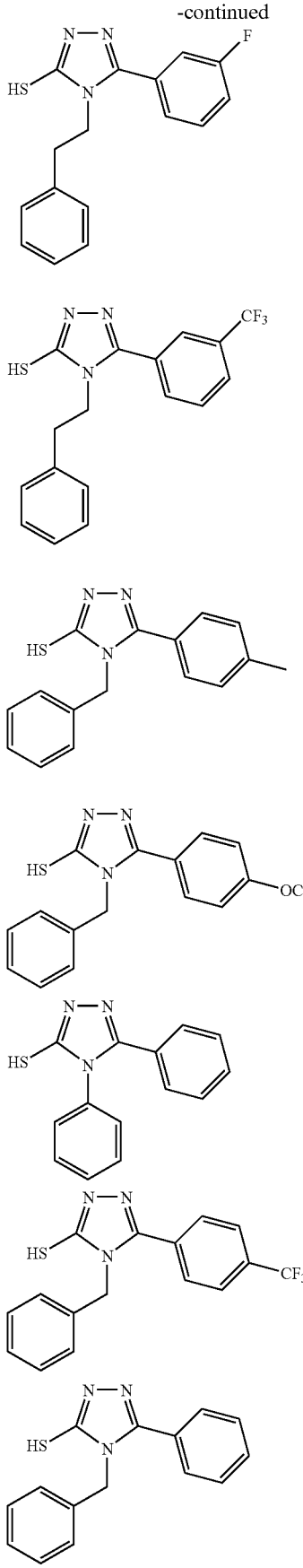
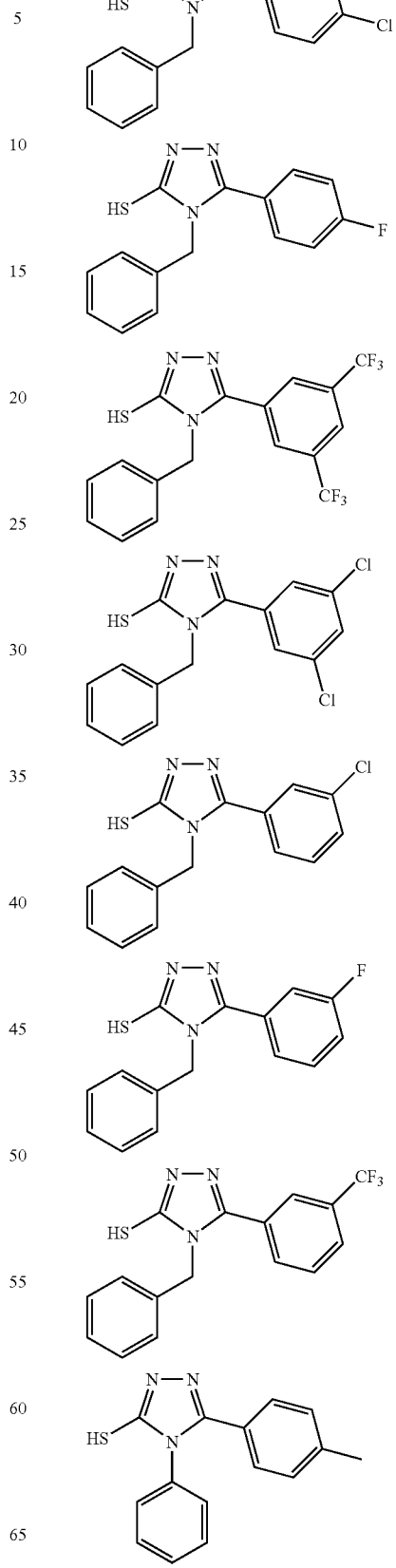

-continued
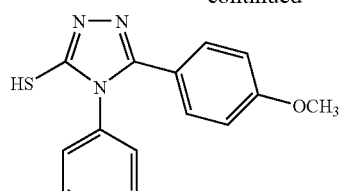
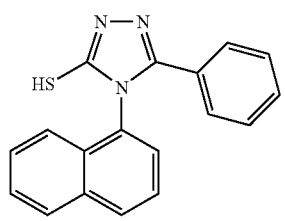
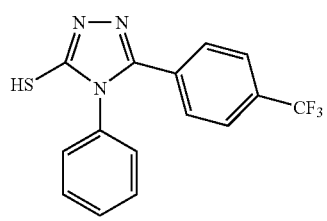
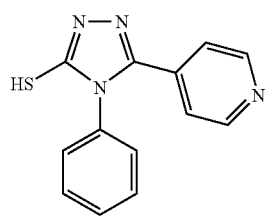
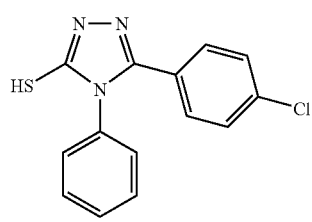
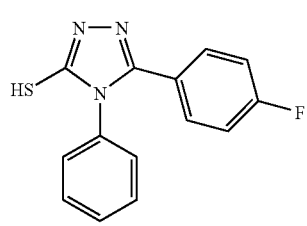
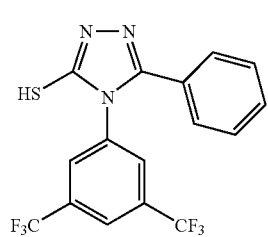
-continued
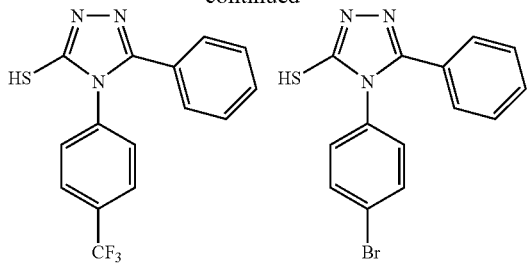
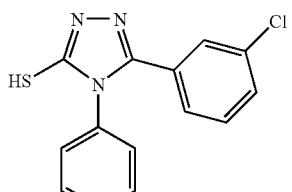
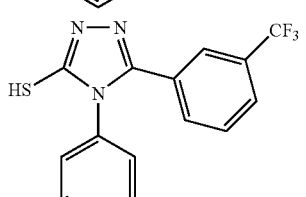
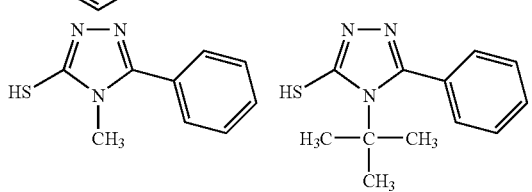
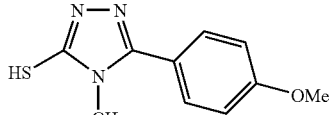
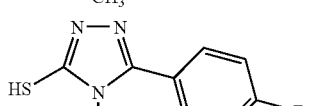
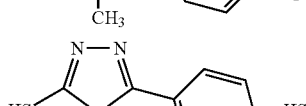
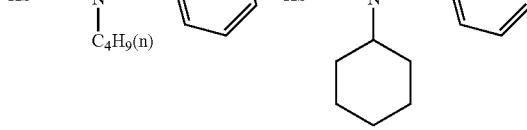
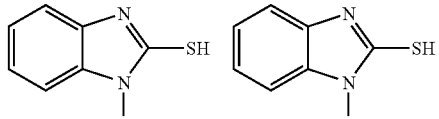
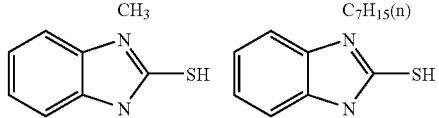
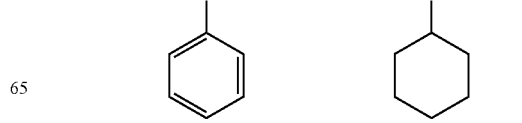

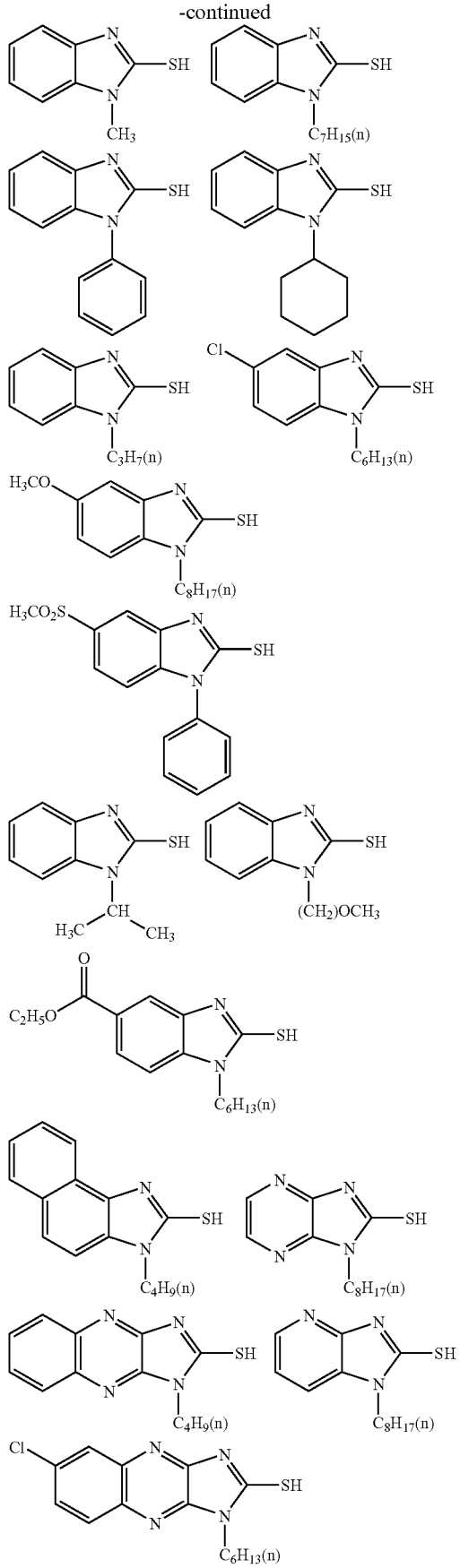

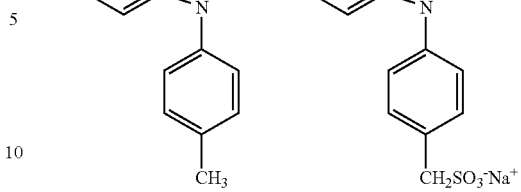

The thiol compound is used in an amount of preferably from 0.01 to 20% by mass based on the total solid components in the photosensitive layer, more preferably from 0.1 to 15% by mass and more preferably from 1.0 to 10% by mass.
<Microcapsule>

As a method of adding the components constituting the photosensitive layer as described above and other components to the photosensitive layer, it is possible in the invention that a part of the constituting components is encapsulated in a microcapsule and then added to photosensitive layer as reported in JP-A-2001-277740 and JP-A-2001-277742. In this case, the individual constituting components may be contained inside and outside in the microcapsules at an arbitrary ratio.

For microencapsulating the component of the photosensitive layer, use can be made of publicly known methods. The manufacturing methods of microcapsules include, for example, the methods using coacervation disclosed in U.S. Pat. Nos. 2,800,457 and 2,800,458, the methods using interfacial polymerization disclosed in U.S. Pat. No. 3,287,154, JP-B-38-19574 and JP-B-42-446, the methods using the precipitation of a polymer disclosed in U.S. Pat. Nos. 3,418,250 and 3,660,304, the method using isocyanate polyol wall materials disclosed in U.S. Pat. No. 3,796,669, the method using isocyanate wall materials disclosed in U.S. Pat. No. 3,914,511, the methods using urea-formaldehyde- or urea-formaldehyde-resorcinol-based wall-forming materials disclosed in U.S. Pat. Nos. 4,001,140, 4,087,376 and 4,089,802, the method using wall materials made of, for example, a melamine-formaldehyde resin or hydroxy cellulose disclosed in U.S. Pat. No. 4,025,445, the in situ methods by monomer polymerization disclosed in JP-B-36-9163 and JP-B-51-9079, the spray drying methods disclosed in British Patent 930,422 and U.S. Pat. No. 3,111,407, and the electrolytic dispersion cooling methods disclosed in British Patents 952,807 and 967,074, though the invention is not limited to these methods.

A microcapsule wall preferably usable in the invention is one which has a three-dimensional crosslinkage structure and swells with a solvent. From these points of view, preferable examples of the microcapsule wall material include polyurea, polyurethane, polyester, polycarbonate, polyamide and a mixture thereof Among all, polyurea and polyurethane are preferred. It is also possible to introduce a compound having a crosslinkable functional group such as an ethylenically unsaturated bond, which can be introduced into the water-insoluble polymer as discussed above, into the microcapsule wall.

The average particle diameter of the above-described microcapsules is preferably from 0.01 to 3.0 µm, more preferably from 0.05 to 2.0 µm and particularly preferably from 0.10 to 1.0 µm. Within this range, a favorable resolution and a high aging stability can be obtained.

<Other Component of Photosensitive Layer>

If necessary, the photosensitive layer of the invention may further contain various additives. Now, these additives will be illustrated.

<Surfactant>

It is preferable in the invention to use a surfactant in the photosensitive layer to promote the developability and improve the coated face properties. As the surfactant, there can be enumerated a nonionic surfactant, an anionic surfactant, a cationic surfactant, an amphoteric surfactant and a fluorinated surfactant. Either a single surfactant or a combination of two or more kinds thereof may be used.

The nonionic surfactant to be used in the invention is not particularly restricted and any publicly known one may be used. Examples thereof include polyoxyethylene alkyl ethers, polyoxyethylene alkylphenyl ethers, polyoxyethylene polystyrylphenyl ethers, polyoxyethylene-polyoxypropylene alkyl ethers, glycerol/fatty acid partial esters, sorbitan/fatty acid partial esters, pentaerythritol/fatty acid partial esters, propylene glycol/fatty acid monoesters, sucrose/fatty acid partial esters, polyoxyethylene-sorbitan/fatty acid partial esters, polyoxyethylene-sorbitol/fatty acid partial esters, polyethylene glycol/fatty acid esters, polyglycerol/fatty acid partial esters, polyoxyethylene/castor oil compounds, polyoxyethylene-glycerol/fatty acid partial esters, fatty acid diethanolamides, N,N-bis-2-hydroxyalkylamines, polyoxyethylene alkylamines, triethanolamine/fatty acid esters, trialkylamine oxides, polyethylene glycol and a polyethylene glycol-polypropylene copolymer.

The anionic surfactant to be used in the invention is not particularly restricted and any publicly known one may be used. Examples thereof include fatty acid salts, abietic acid salts, hydroxyalkanesulfonic acid salts, alkanesulfonic acid salts, dialkylsulfosuccinic acid ester salts, (linear alkyl)benzenesulfonic acid salts, (branched alkyl)benzenesulfonic acid salts, alkylnaphthalenesulfonic acid salts, alkylphenoxypolyoxyethylenepropylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated beef tallow oil, sulfate salts of fatty acid alkyl esters, alkylsulfuric acid ester salts, polyoxyethylene alkyl ether sulfate salts, fatty acid monoglyceride sulfate salts, polyoxyethylene alkylphenyl ether sulfate salts, polyoxyethylene styrylphenyl ether sulfate salts, alkylphosphoric acid ester salts, polyoxyethylene alkyl ether phosphate salts, polyoxyethylene alkylphenyl ether phosphate salts, partially saponified styrene/maleic anhydride copolymers, partially saponified olefin/maleic anhydride copolymers, and naphthalenesulfonic acid salt/formalin condensates.

The cationic surfactant to be used in the invention is not particularly restricted and any publicly known one may be used. Examples thereof include alkylamine salts, quaternary ammonium salts, polyoxyethylene alkylamine salts, and polyethylene polyamine derivatives.

The amphoteric surfactant to be used in the invention is not particularly restricted and any publicly known one may be used. Examples thereof include carboxybetaines, aminocarboxylic acids, sulfobetaines, aminosulfuric acid esters, and imidazoline compounds.

In the surfactants enumerated above, the "polyoxyethylene" can be replaced with a polyoxyalkylene such as polyoxymethylene, polyoxypropylene, or polyoxybutylene. Such surfactants also are usable in the present invention.

More preferred surfactants are fluorinated surfactants having a perfluoroalkyl group in molecule. Examples of such fluorinated surfactants include anionic compounds such as perfluoroalkylcarboxylic acid salts, perfluoroalkylsulfonic acid salts, and perfluoroalkylphosphoric acid esters; amphoteric compounds such as perfluoroalkylbetaines; cationic compounds such as perfluoroalkyltrimethylammonium salts; and nonionic compounds such as perfluoroalkylamine oxides, perfluoroalkyl/ethylene oxide adducts, oligomers containing a perfluoroalkyl group and a hydrophilic group, oligomers containing a perfluoroalkyl group and an oleophilic group, oligomers containing a perfluoroalkyl group, a hydrophilic group, and an oleophilic group, and urethanes containing a perfluoroalkyl group and an oleophilic group. As appropriate examples thereof, moreover, the fluorinated surfactants described in JP-A-62-170950, JP-A-62-226143 and JP-A-60-168144 may be cited.

Either a single surfactant or a combination of two or more kinds thereof may be used.

The content of the surfactant is preferably from 0.001 to 10% by mass, more preferably from 0.01 to 7% by mass, based on the total solid components in the photosensitive layer.

<Colorant>

In the invention, dyes having a large absorption within the visible light range can be used as image colorants. Specific examples of these dyes include Oil Yellow #101, Oil Yellow #103, Oil Pink #312, Oil Green BG, Oil Blue BOS, Oil Blue #603, Oil Black BY, Oil Black ES, Oil Black T-505 (manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes which are disclosed in JP-A-62-293247. Further, dyes such as phthalocyanine-based dye, azo-based dye, carbon black and titanium oxide are preferably usable.

It is preferable to add these colorants so as to make an image area distinguishable from a non-image area after the image formation. The amount of these colorants to be incorporated in the image forming layer is preferably from 0.01 to 10% by mass based on the total solid content in the image-recording material.

<Printing Agent>

In order to form a printed-out image, the photosensitive layer of the invention may contain a compound which changes its color when exposed to an acid or a radical. Examples of such a compound advantageously usable herein include various dyes such as diphenylmethane-based dyes, triphenylmethane-based dyes, thiazine-based dyes, oxazine-based dyes, xanthene-based dyes, anthraquinone-based dyes, iminoquinone-based dyes, azo-based dyes and azomethine-based dyes.

Specific examples of these dyes include dyes such as Brilliant Green, Ethyl Violet, Methyl Green, Crystal Violet, Basic Fuchsine, Methyl Violet 2B, Quinacridone Red, Rose Bengal, Metanil Yellow, Thymol Sulfophthalein, Xylenol Blue, Methyl Orange, Paramethyl Red, Congo Red, Benzopurpurine 4B, α-Naphthyl Red, Nile Blue 2B, Nile blue A, Methyl Violet, Malachite Green, Parafuchsine, Victoria Pure Blue BOH [manufactured by HODOGAYA CHEMICAL CO., LTD.], Oil Blue #603 [manufactured by Orient Chemical Industries, Ltd.], Oil Pink #312 [manufactured by Orient Chemical Industries, Ltd.], Oil Red 5B [manufactured by Orient Chemical Industries, Ltd.], Oil Scarlet #308 [manufactured by Orient Chemical Industries, Ltd.], Oil Red OG [manufactured by Orient Chemical Industries, Ltd.], Oil Red RR [manufactured by Orient Chemical Industries, Ltd.], Oil Green #502 [manufactured by Orient Chemical Industries, Ltd.], Spiron Red BEH Special [manufactured by HODOGAYA CHEMICAL CO., LTD.], m-Cresol Purple, Cresol Red, Rhodamine B, Rhodamine 6G, Sulfo Rhodamine B, Auramine, 4-p-diethylaminophenyliminonaphthoquinone, 2-carboxyanilino-4-p-diethylaminophenylimino naphthoquinone, 2-carboxystearylamino-4-p-N,N-bis(hydroxyethyl)amino-phenyliminonaphthoquinone, 1-phenyl-3-methyl-4-p-diethylaminophenylimino-5-pyrazolones and 1-β-naphthyl-4-p-diethylaminophenyl imino-5-pyrazolone, and leuco dyes such as p,p',p''-hexamethyltriaminotriphenylmethane (leucocrystal violet) and Pergascript Blue SRB (manufactured by Ciba Geigy Inc.).

Other examples of dyes employable herein include leuco dyes which are known as material of heat-sensitive paper and pressure-sensitive paper. Specific examples of these leuco dyes include Crystal Violet Lactone, Malachite Green Lactone, Benzoyl Leuco Methylene Blue, 2-(N-phenyl-N-methylamino)-6-(N-p-tollyl-N-ethyl)aminofluorane, 2-anilino-3-methyl-6-(N-ethyl-p-toluidino)fluorine, 3,6-dimethoxyfluorane, 3-(N,N-diethylamino)-5-methyl-7-(N,N-dibenzylamino)-fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-xaphthalide, and 3-(4-diethylaminophenyl)-3-(1-ethyl-2-methylindol-3-yl) phthalide.

The amount of each dye which changes its color when exposed to an acid or a radical is from 0.01 to 15% by mass based on the solid content of the photosensitive layer.

<Polymerization Inhibitor>

The photosensitive layer of the invention preferably comprises a small amount of a heat polymerization inhibitor to inhibit unnecessary heat polymerization of radical-polymerizable compounds during the production or storage of the photosensitive layer.

Preferable examples of the heat polymerization inhibitor usable herein include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitroso-N-phenylhydroxylamine aluminum salt.

The amount of the heat polymerization inhibitor to be added is preferably from about 0.01 to about 5% by mass based on the total solid content of the photosensitive layer.

<Higher Fatty acid Derivative>

The photosensitive layer of the invention may comprise a high fatty acid derivative such as behenic acid and behenic acid amide or the like so that it is localized on the surface of the photosensitive layer during drying following coating to prevent the inhibition of polymerization by oxygen. The amount of the higher fatty acid derivative to be added is preferably from about 0.1 to about 10% by mass based on the total solid content of the photosensitive layer.

<Plasticizer>

The photosensitive layer of the invention may comprise a plasticizer. Preferable examples of the plasticizer usable herein include phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate and diallyl phthalate; glycol esters such as dimethyl glycol phthalate, ethylphthalylethyl glycolate, methylphthalylethyl glycolate, butylphthalylbutyl glycolate and triethyleneglycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerintriacetyl ester and butyl laurate. The content of the plasticizer is preferably about 30% by mass or less based on the total solid content of the photosensitive layer.

<Inorganic Microparticles>

The photosensitive layer of the invention may comprise inorganic microparticles to enhance the strength of hardened film on an image area. Preferable examples of the inorganic microparticles usable herein include those made of silica, alumina, magnesium oxide, titanium oxide, magnesium carbonate, calcium alginate or a mixture thereof. These inorganic microparticles may be used to reinforce the film and elevate the interfacial adhesiveness after surface roughening even if they are not capable of converting light to heat. The inorganic microparticles preferably have an average particle diameter of from 5 nm to 10 μm, more preferably from 0.5 μm to 3 μm. Within this range, the inorganic microparticles can be dispersed in the photosensitive layer in a stable manner to keep the strength of the photosensitive layer sufficiently high, making it possible to form a non-image area having an excellent hydrophilicity which suffers from little stain during printing.

The inorganic microparticles as described above can be easily available as a commercial product such as a colloidal silica dispersion.

The content of the inorganic microparticles is preferably 20% by mass or less, more preferably 10% by mass or less based on the total solid content of the photosensitive layer.

<Low Molecular Hydrophilic Compound>

The photosensitive layer of the invention may comprise a hydrophilic low molecular compound to enhance the on-press developability thereof. Examples of the hydrophilic low molecular compound usable herein include water-soluble organic compounds such as glycol (for example, ethylene glycol, diethylene glycol, triethylene glycol, propylene glycol, dipropylene glycol, tripropylene glycol) and ether or ester derivatives thereof, polyhydroxy compounds (for example, glycerin, pentaerythritol), organic amines (for example, triethanolamine, diethanolamine, monoethanolamine) and salts thereof, organic sulfonic acids (for example, toluenesulfonic acid, benzenesulfonic acid) and salts thereof, organic phosphonic acids (for example, phenylphosphonic acid) and salts thereof, organic carboxylic acids (for example, tartaric acid, oxalic acid, citric acid, malic acid, lactic acid, gluconic acid, amino acids) and salts thereof, and organic quaternary ammonium salts (for example, tetraethylamine hydrochloride).

In addition to the components as described above, the photosensitive layer of the invention may contain, for example, a cosensitizer.

<Formation of Photosensitive Layer>

The photosensitive layer of the invention is formed by preparing a coating solution by dispersing or dissolving the above-described necessary components in a solvent and then coating the same. Examples of the solvent usable herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyl lactone, toluene, and water, though the invention is not limited to these solvents. Either a single solvent or a mixture thereof may be used. The solid concentration of the coating solution is preferably from 1 to 50% by mass.

It is also possible to form the photosensitive layer of the invention by preparing a plurality of coating solutions having the same or different components selected from the above-described ones dispersed or dissolved in the same or different solvents, and then repeating coating and drying.

Although the photosensitive layer coating amount (solid content) on the support obtained after coating and drying varies depending on the purpose, it is preferably from 0.3 to 3.0 g/m$^2$. Within this range, a good sensitivity and favorable film properties of the photosensitive layer can be achieved.

The coating may be conducted by various methods. Examples of the coating method usable herein include the bar coating method, the rotary coating method, the spray coating method, the curtain coating method, the dip coating method, the air knife coating method, the blade coating method and the roll coating method.

<Protective Layer>

In the lithographic printing plate precursor of the invention, it is preferable to form a protective layer (an oxygen block layer) on the photosensitive layer to prevent the diffusion and invasion of oxygen which inhibits the polymerization at exposure. The protective layer to be used in the invention preferably has have a low oxygen transmission rate A, i.e., $1.0 \leq A \leq 20$ (mL/m$^2$ day) at 25° C. under one atom. When the oxygen transmission rate A is extremely low, i.e., less than 1.0 (mL/m$^2$ day), there arise some problems such that unnecessary polymerization occurs during manufacturing or storage or unnecessary fogging or line thickening occurs at image exposure. When the oxygen transmission rate A is excessively high, i.e., more than 20 (mL/m$^2$ day), the sensitivity is lowered. More preferably, the oxygen transmission rate falls within the range $1.5 \leq A \leq 12$ (mL/m$^2$ day), more preferably $2.0 \leq A \leq 10.0$ (mL/m$^2$ day). In addition to the oxygen transmission rate as discussed above, it is desirable that the protective layer does not substantially inhibit the transmission of light to be used in exposure, shows an excellent adhesion to photosensitive layer and can be easily removed in the development step after exposure. Various studies have been made on such a protective layer as having these properties. For the details of these studies, reference can be made to U.S. Pat. No. 3,458,311 and JP-A-55-49729.

As the material usable in the protective layer, it is preferable to use a water-soluble high molecule compound having a relatively excellent crystallinity. Specific examples thereof usable herein include water-soluble polymers such as polyvinyl alcohol, a vinyl alcohol/vinyl phthalate copolymer, a vinyl acetate/vinyl alcohol/vinyl phthalate copolymer, a vinyl acetate/crotonic acid copolymer, polyvinylpyrrolidone, acidic cellulose, gelatin, gum arabic, polyacrylic acid and polyacrylamide. Either one of these compounds or a mixture thereof may be used. Among all, use of polyvinyl alcohol as the main component makes it possible to give the best results with respect to basic properties such as oxygen barrier properties and development removability.

The polyvinyl alcohol to be used in the protective layer may be partly substituted by ester, ether or acetal and may partly have other copolymerizable components so far as it has unsubstituted vinyl alcohol units for imparting necessary oxygen barrier properties and water solubility to the protective layer. Examples of the polyvinyl alcohol usable herein include those having a polymerization degree of from 300 to 2,400 which have been hydrolyzed in a proportion of from 71 to 100%. Specific examples of these polyvinyl alcohols include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 manufactured by KURARAY CO., LTD. Either one of these compounds or a mixture thereof may be used. In a preferred embodiment, the content of polyvinyl alcohol in the protective layer is from 20 to 95% by mass, more preferably from 30 to 90% by mass.

Also, use can be preferably made of publicly known denatured polyvinyl alcohols. Examples thereof include polyvinyl alcohols having various polymerization degrees which carry at random various hydrophilic denaturation sites (for example, an anionic denaturation site having been denatured by an anion such as a carboxyl group or a sulfo group; a cationic denaturation site having been denatured by a cation such as an amino group or an ammonium group; a silanol denaturation site; and a thiol denaturation site), and polyvinyl alcohols having various polymerization degrees which carry the above-described anionic denaturation site, cationic denaturation site, silanol denaturation site and thiol denaturation site together with various denaturation sites (for example, an alkoxyl denaturation site, a sulfide denaturation site, an ester denaturation site of vinyl alcohol with various organic acids, an ester denaturation site of the above-described anion denaturation site with an alcohol and an epoxy denaturation site) at the terminus of the polymer chain.

As a components to be used as a mixture with polyvinyl alcohol, polyvinylpyrrolidone or its denaturation product is preferred from the viewpoints of oxygen barrier properties and development removability. The content thereof in the protective layer is from 3.5 to 80% by mass, preferably from 10 to 60% by mass and more preferably from 15 to 30% by mass.

The constituents (e.g., selection of PVA, use of additives), coating amount and so on of the protective layer are properly predetermined taking into account oxygen barrier properties, development removability, foggability, adhesion, scratch resistance, etc. In general, the higher the percent hydrolysis of PVA is (i.e., the higher the content of unsubstituted vinyl alcohol units in the protective layer is) or the greater the thickness of the protective layer is, the better are the oxygen barrier properties to advantage from the standpoint of sensitivity. A PVA (co)polymer having a molecular weight of from 2000 to 10000000 are usable and one having a molecular weight of form 20000 to 3000000 is appropriate.

As other components of the protective layer, glycerin, dipropylene glycol or the like may be added in an amount of few percents by mass based on the (co)polymer to impart flexibility to the protective layer. Further, an anionic surfactant such as sodium alkylsulfate and sodium alkylsulfonate, an amphoteric surfactant such as alkylaminocarboxylate and alkylaminodicarboxylate and a nonionic surfactant such as polyoxyethylene alkyl phenyl ether may be added to the protective layer in an amount of few percents by mass based on the (co)copolymer.

Moreover, the adhesion to an image area, scratch resistance, etc. are highly important from the standpoint of handleability of the lithographic printing plate precursor That is, when the hydrophilic layer comprising a water-soluble polymer is laminated on the oleophilic photosensitive layer, insufficient adhesion force frequently causes peeling. As a result, there arise detectives such as malhardening due to inhibition of polymerization by oxygen at the peeled area. To overcome this problem, various proposals have been made. For example, U.S. Pat. Nos. 292,501 and 44,563 disclose that sufficient adhesion can be established by laminating a hydrophilic polymer mainly composed of a polyvinyl alcohol mixed with from 20 to 60% by mass of an acrylic emulsion, a water-insoluble vinyl pyrrolidone/vinyl acetate copolymer, etc. on the photosensitive layer. Any of these publicly known techniques may be applied to the protective layer of the present invention. For the details of the method of coating the protective layer coating solution, reference can be made to, for example, U.S. Pat. No. 3,458,311 and JP-B-55-49729.

It is also preferred that the protective layer of the lithographic printing plate precursor of the invention contains an inorganic stratiform compound to improve oxygen barrier properties and protective effect on the photosensitive layer surface.

The stratiform compound is a particle having a thin tabular shape. The stratiform compound includes, for example, mica materials such as natural mica represented by the following formula:

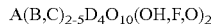

$$A(B,C)_{2\text{-}5}D_4O_{10}(OH,F,O)_2$$

(wherein A represents any one of K, Na and Ca; B and C each represents any one of Fe (II), Fe(III), Mn, Al, Mg and V; and D represents Si or Al) or synthetic mica; talc represented by the following formula: $3MgO.4SiO_2.H_2O$; teniolite; montmorillonite; saponite; hectolite; and zirconium phosphate.

Examples of the natural mica include muscovite, paragonite, phlogopite, biotite and lepidolite. Examples of the synthetic mica include non-swellable mica such as fluorine phlogopite $KMg_3(AlSi_3O_{10})F_2$ or potassium tetrasilic mica $KMg_{2.5}(Si_4O_{10})F_2$, and swellable mica such as Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}Li)_{1/8}(Si_4O_{10})F_2$. Synthetic smectite is also useful.

Among the inorganic stratiform compounds as cited above, fluorine based swellable mica which is a synthetic inorganic stratiform compound is particularly useful in the invention. Namely, this swellable synthetic mica or a swellable clay mineral such as montmorillonite, saponite, hectolite or bentonite has a stratiform structure comprising a unit crystal lattice layer having thickness of approximately 10 to 15 angstroms and metallic atom substitution in the lattices is extremely large compared with other clay minerals. As a result, the lattice layer results in lack of positive charge and to compensate it, a cation, for example, $Na^+$, $Ca^{2+}$ or $Mg^{2+}$ is adsorbed between the lattice layers. The cation located between these layers is called an exchangeable cation which is exchanged by various cations. When the cation between the layers if $Li^+$ or $Na^+$ having a small ion radius, the bond between the lattice layers is weak so that the compound largely swells in water. When a shear is applied in this state, the stratiform crystal lattices are easily cleaved to form a stable sol in water. This tendency is stronger in bentnite and swellable synthetic mica which are therefore useful in the invention. In particular, it is preferred to use swellable synthetic mica.

Concerning the shape of the inorganic stratiform compound used in the invention, the thinner the thickness or the larger the plain size, so long as smoothness of coated surface and transmission of active ray are not damaged, are the better from the viewpoint of regulating diffusion. Therefore, an aspect ratio of the stratiform compound is ordinarily 20 or more, preferably 100 or more, and particularly preferably 200 or more. The aspect ratio is a ratio of thickness to a major axis of particle and can be determined, for example, from a projection drawing of particle in a microphotograph. The larger the aspect ratio, the greater effect can be obtained.

Concerning the particle size of the inorganic stratiform compound used in the invention, an average particle size is ordinarily from 0.3 to 20 µm, preferably from 0.5 to 10 µm, and particularly preferably from 1 to 5 µm. An average thickness of the particle is ordinarily 0.1 µm or less, preferably 0.05 µm or less, and particularly preferably 0.01 µm or less. For example, the swellable synthetic mica that is the typical compound of the inorganic stratiform compounds has a thickness of approximately from 1 to 50 nm and a plain size of approximately from 1 to 20 µm.

By adding particles of the inorganic stratiform compound having such a large aspect ratio as discussed above into the protective layer, coating film strength increases and the penetration of oxygen or water can be effectively inhibited, thereby preventing degradation of the protective layer due to deformation. Also, even when the lithographic printing plate precursor is stored under a high humidity condition for a long period of time, degradation of the image-forming property of the lithographic printing plate precursor due to a humidity change is prevented and a high storage stability is obtained.

The content of the inorganic stratiform compound in the protective layer is preferably from 5/1 to 1/100 based on the mass of the binder used in the protective layer. When two or more kinds of the inorganic stratiform compounds are used together, it is preferred that the total amount of the inorganic stratiform compounds satisfies the range of mass ratio described above.

Next, an example of commonly employed methods for dispersing the stratiform compound used in the protective layer will be illustrated. First, from 5 to 10 parts by mass of a swellable stratiform compound that is exemplified as a preferred stratiform compound is added to 100 parts by mass of water. After the compound is made thoroughly compatible with water and swollen, the mixture is dispersed using a dispersing machine. Examples of the dispersing machine usable herein include a variety of mills conducting dispersion by directly applying mechanical power, a high-speed agitation type dispersing machine providing a large shear force and a dispersing machine providing ultrasonic energy of high intensity. Specific examples thereof include a ball mill, a sand grinder mill, a visco mill, a colloid mill, a homogenizer, a dissolver, a Polytron, a homomixer, a homoblender, a Keddy mill, a jet agitor, a capillary emulsifying device, a liquid siren, an electromagnetic strain type ultrasonic generator and an emulsifying device having a Polman whistle. The dispersion containing 5 to 10% by mass of the inorganic stratiform compound having been thus dispersed is highly viscous or in the form of gel and exhibits an extremely high storage stability. To prepare a coating solution for protective layer using the dispersion, it is preferred that the dispersion is diluted with water, thoroughly agitated and then blended with a binder solution.

To the coating solution for protective layer, it is possible to add known additives, for example, a surfactant for improving coating properties or a water-soluble plasticizer for improving physical properties of a coating film. Examples of the water-soluble plasticizer include propionamide, cyclohexanediol, glycerin and sorbitol. Also, a water-soluble (meth) acrylic polymer may be added. Further, publicly known additives may be added to the coating solution for improving adhesion to the photosensitive layer or preservation stability of the coating solution.

The thus prepared coating solution for protective layer is coated on the photosensitive layer provided on a support and dried to form a protective layer. A coating solvent can be appropriately selected by considering the relationship with the binder used. When a water-soluble polymer is used, it is preferred to employ distilled water or purified water as the coating solvent. A coating method of the protective layer is not particularly restricted and publicly known methods such as methods described in U.S. Pat. No. 3,458,311 and JP-B-5549729 can be used. More specifically speaking, the protective layer is coated by, for example, a blade coating method, an air knife coating method, a gravure coating method, a roll coating method, a spray coating method, a dip coating method or a bar coating method.

The coating amount of the protective layer is preferably from 0.05 to 10 g/m$^2$. In the case of containing an inorganic stratiform compound, it is more preferable that the coating amount is from 0.1 to 0.5 g/m$^2$. In the case of not containing an inorganic stratiform compound, it is more preferable that the coating amount is from 0.5 to 5 g/m$^2$.

[Support]

The support to be used in the lithographic printing plate precursor according to the invention is not particularly restricted so long as it is a dimensionally stable plate-like hydrophilic material. For example, use can be made of paper, plastic, paper laminated with plastic (for example, polyethylene, polypropylene or polystyrene), a metal plate (for example, an aluminum, zinc or copper plate), a plastic film (for example, a cellulose diacetate, cellulose triacetate, cellulose propionate, cellulose butyrate, cellulose acetatebutyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include, a polyester film and an aluminum plate. Among them, the aluminum plate is preferred because of having good dimensional stability and being relatively inexpensive.

The aluminum plate may be a pure aluminum plate, an alloy plate comprising aluminum as the main component and containing a trace amount of hetero elements or a thin film of aluminum or aluminum alloy laminated with plastic. Examples of the hetero element contained in the aluminum alloy includes silicon, iron, manganese, copper, magnesium, chromium, zinc, bismuth, nickel and titanium. The content of the hetero element in the alloy is preferably 10% by mass or less. Although a pure aluminum plate is preferred in the invention, it is difficult to produce completely pure aluminum in view of the refining technique. Thus, the aluminum plate may slightly contain the hetero element. The composition of the aluminum plate is not specified and use can be appropriately made of materials that have been conventionally known and used.

The thickness of the support is preferably from 0.1 to 0.6 mm, more preferably from 0.15 to 0.4 mm and particularly preferably from 0.2 to 0.3 mm.

Prior to using the aluminum plate, it is preferable to conduct a surface treatment such as a surface roughening treatment or an anodic oxidation treatment. The surface treatment facilitates improvement in the hydrophilic properties and ensures good adhesion between the photosensitive layer and the support. Prior to the surface roughening treatment of the aluminum plate, a degreasing treatment using, for example, a surfactant, an organic solvent or an aqueous alkaline solution may be conducted for removing rolling oil on the surface thereof, if desired.

The surface roughening treatment of the surface of the aluminum plate is conducted by various methods, for example, a mechanical roughening treatment, an electrochemical roughening treatment (a roughening treatment of electrochemically dissolving the surface) and a chemical roughening treatment (roughening treatment of chemically dissolving the surface selectively).

As the method of the mechanical roughening treatment, use can be made of a publicly known method such as ball grinding, brush grinding, blast grinding or buff grinding.

Examples of the electrochemical roughening treatment method include a method wherein the aluminum plate is treated with an alternating current or a direct current in an electrolyte containing an acid such as hydrochloric acid or nitric acid. Also, a method of using a mixed acid described in JP-A-54-63902 can be used therefor.

The surface-roughened aluminum plate is then subjected, if desired, to an alkali etching treatment using an aqueous solution of, for example, potassium hydroxide or sodium hydroxide. After further performing a neutralizing treatment, the aluminum plate is subjected to an anodic oxidation treatment to thereby increase the abrasion resistance, if desired.

As the electrolyte to be used in the anodic oxidation treatment of the aluminum plate, various electrolytes capable of forming a porous oxide film can be used. In usual, sulfuric acid, hydrochloric acid, oxalic acid, chromic acid or a mixed acid thereof is used. The concentration of the electrolyte can be appropriately determined depending on the kind of the electrolyte.

Since the conditions for the anodic oxidation treatment vary depending on the electrolyte used, they cannot be defined commonly. However, it is usually preferred that electrolyte concentration in the solution is from 1 to 80% by mass, the liquid temperature is from 5 to 70° C., the current density is from 5 to 60 A/dm$^2$, the voltage is from 1 to 100 V, and the electrolysis time is from 10 seconds to 5 minutes. The amount of the anodically oxidized film formed is preferably from 1.0 to 5.0 g/m$^2$ and more preferably from 1.5 to 4.0 g/m$^2$. Within this range, a high printing durability and a high scratch resistance in an non-image area of the lithographic printing plate can be achieved.

As the support to be used in the invention, the aluminum plate having been subjected to the surface treatment and having the anodically oxidized film may be used as such. However, in order to more improve adhesion to a layer provided thereon, hydrophilisity, resistance to stain, heat insulating properties or the like, it is possible to perform an appropriate additional treatment selected from among, for example, a treatment for enlarging micropores or a sealing treatment of micropores of the anodically oxidized film described in JP-A-2001-253181 and JP-A-2001-322365, and a surface hydrophilizing treatment by immersing in an aqueous solution containing a hydrophilic compound. Needless to say, the enlarging treatment and sealing treatment of micropores are not limited to those described in the above documents and any publicly known method may be employed therefor.

As the sealing treatment, use can be made of, for example, a sealing treatment with steam, a sealing treatment with fluorozirconic acid alone, a sealing treatment with an aqueous solution containing an inorganic fluorine compound such as sodium fluoride, a sealing treatment with steam containing lithium chloride or a sealing treatment with hot water.

Among these treatments, it is preferable to employ the seating treatment with an aqueous solution containing an inorganic fluorine compound, the seating treatment with steam or the sealing treatment with hot water.

As the hydrophilicization treatment, use can be made of the alkaline metal silicate method as disclosed in U.S. Pat. Nos. 2,714,066, 3,181,461, 3,280,734 and 3,902,734. This method comprises dipping or electrolyzing the support in an aqueous solution of sodium silicate or the like. Other examples of the hydrophilicization treatment usable herein include the method comprising the treatment with potassium zirconate fluoride as disclosed in JP-B-36-22063, and the method comprising the treatment with a polyvinylphosphonic acid as disclosed in U.S. Pat. Nos. 3,276,868, 4,153,461 and 4,689,272.

In the case where a support having an insufficient hydrophilicity such as polyester film is used as the support of the invention, it is preferable to coat the support with a hydrophilic layer to thereby make the surface thereof hydrophilic. Preferred examples of the hydrophilic layer usable herein include a hydrophilic layer obtained by applying a coating solution containing a colloid of an oxide or hydroxide of at least one element selected from the group consisting of beryllium, magnesium, aluminum, silicon, titanium, boron, germanium, tin, zirconium, iron, vanadium, antimony and transition metals as disclosed in JP-A-2001-199175, a hydrophilic layer having an organic hydrophilic matrix obtained by crosslinking or pseudo-crosslinking an organic hydrophilic polymer as disclosed in JP-A-2002-79772, a hydrophilic layer having an inorganic hydrophilic matrix obtained by sol-gel conversion involving the hydrolysis and condensation reaction of a polyalkoxysilane, titanate, zirconate or aluminate, and a hydrophilic layer made of a thin inorganic layer having a surface containing a metal oxide. Among these hydrophilic layers, the hydrophilic layer obtained by applying a coating solution containing a colloid of silicon oxide or hydroxide is preferred.

In the case where a polyester film or the like is used as the support of the invention, it is preferable that the support is provided with an antistatic layer either or both on the hydrophilic layer side thereof and on the side thereof opposite to the hydrophilic layer. In the case where the antistatic layer is provided between the support and the hydrophilic layer, it also contributes to the improvement in the adhesion to the hydrophilic layer. As the antistatic layer, use can be made of a polymer layer having microparticles of a metal oxide or a matting agent dispersed therein as disclosed in JP-A-2002-79772.

It is preferable that the support to be used in the invention has a central line-average roughness of from 0.10 to 1.2 μm. Within this range, a good adhesion to the image-forming layer, a prolonged press life and a good stain resistance can be imparted to the support.

The color density of the support is preferably from 0.15 to 0.65 as expressed in reflection density. Within this range, an anti-halation effect can be established and thus good image-forming properties during imagewise exposure and good inspectability after development are obtained.

[Undercoat Layer]

It is preferable that the lithographic printing plate precursor of the invention has an undercoat layer, which contains a compound having a polymerizable group, on the support In the case of forming the undercoat layer, the photosensitive layer is provided on the undercoat layer. In an exposed area, the undercoat layer strengthens the adhesion between the support and the photosensitive layer. In an unexposed area, the undercoat layer facilitates the peeling of the photosensitive layer from the support, thereby improving the developability.

Preferred examples of the undercoat layer usable herein include a silane coupling agent having an addition-polymerizable ethylenically double bond reactive group as disclosed in JP-A-10-282679, and phosphorus compounds having an ethylenically double bond reactive group as disclosed in JP-A-2-304441. Particularly preferable compounds include those having a polymerizable group such as a methacryl group or an aryl group and a support-adsorptive group such as a sulfonate group, a phosphate group or a phosphoric ester. Moreover, compounds having a hydrophilicity-imparting group such as an ethylene oxide group together with the polymerizable group and the support-adsorptive group can be cited as preferable compounds.

The coating amount (solid content) of the undercoat layer is preferably from 0.1 to 100 mg/m$^2$, more preferably from 1 to 30 mg/m$^2$.

[Backcoat Layer]

After subjecting the support to the surface treatment or forming the undercoat layer thereon, a backcoat layer may be formed on the back side of the support, if necessary.

Preferred examples of the backcoat layer usable herein include a layer made of an organic polymer compound as disclosed in JP-A-5-45885, and a layer made of a metal oxide obtained by the hydrolysis or polycondensation of an organic metal compound or inorganic metal compound as disclosed in JP-A-6-35174. In particular, it is preferred to use silicon alkoxy compounds such as $Si(OCH_3)_4$, $Si(OC_2H_5)_4$, $Si(OC_3H_7)_4$ and $Si(OC_4H_9)_4$ from the viewpoints of being inexpensive and easily available.

[Plate-Making Method]

The lithographic printing plate precursor according to the invention is exposed imagewise preferably by a light source of 350 nm to 450 nm. Next, the protective layer and the photosensitive layer in an unexposed area are removed all at once by rubbing the surface of the plate face (the photosensitive layer) with a rubbing member included in an automatic processor, in the presence of a developing solution having pH of 2 to 10. Thus, an image can be formed on the surface of the aluminum plate support.

Namely, after removing the protective layer and the part of the photosensitive layer all at once, the resulting printing plate can be immediately mounted on a printing press and printing can be conducted.

The processing by the automatic processor in the above-described manner is advantageous in that no measures is required against development scum resulting from the protective layer/photosensitive layer that encounters in on-press development.

The developing solution to be used in the invention is an aqueous solution having pH of 2 to 10. For instance, it is preferable that the developing solution comprises water alone or an aqueous solution containing water as the main component (containing 60% by mass or more of water). It is particularly preferable to use an aqueous solution having the same composition as publicly known fountain solution, an aqueous solution containing a surfactant (for example, an anionic, nonionic or cationic surfactant) or an aqueous solution containing a water-soluble high molecule compound are preferable. Among all, an aqueous solution containing both a surfactant and a water-soluble high molecule compound is preferable. The pH of the developing solution is preferably from 3 to 8, more preferably from 4 to 7.

In the case of using the acidic or neutral developing solution, it is preferable to incorporate an organic acid or an inorganic acid into the developing solution. By the incorporation of organic acid or inorganic acid, the developability is improved at the plate-making and the occurrence of stain on the non-image area of a printing plate obtained by the plate-making is prevented.

Examples of the anionic surfactant usable in the invention include, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salts, N-alkylsulfosuccinic acid monoamide disodium salts, petroleum sulfonic acid salts, sulfated castor oil, sulfated beef tallow oil, sulfate ester salts of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Among these surfactants, dialkylsulfosuccinic acid salts, alkyl sulfate ester salts and alkylnaphthalenesulfonic acid salts are particularly preferably used.

The cationic surfactant usable in the invention is not particularly limited and publicly known cationic surfactants can be used therefor. Examples thereof include alkylamine salts, quaternary ammonium salts, polyoxyethylene alkyl amine salts and polyethylene polyamine derivatives.

Examples of the nonionic surfactant usable in the invention include polyethylene glycol type higher alcohol ethylene oxide adducts, alkylphenol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines.

Either one of these nonionic surfactants or a mixture two or more kinds thereof may be used. In the invention, ethylene oxide adducts of sorbitol and/or sorbitan fatty acid esters, polypropylene glycol ethylene oxide adducts, dimethylsiloxane-ethylene oxide block copolymers, dimethylsiloxane-(propylene oxide-ethylene oxide) block copolymers and fatty acid esters of polyhydric alcohols are more preferable.

Further, from the viewpoint of stable solubility in water or turbidity, it is preferable that the nonionic surfactant to be used in the developing solution according to the invention has an HLB (hydrophile-lipophile balance) value of preferably 6 or more, more preferably 8 or more. Moreover, the content of the nonionic surfactant in the developing solution is preferably from 0.01 to 10% by mass, more preferably from 0.01 to 5% by mass.

Furthermore, use can be also made of an oxyethylene adduct of acetylene glycol type or acetylene alcohol type or a fluorine-based surfactant or a silicon-based surfactant.

As the surfactant to be used in the developing solution according to the invention, the nonionic surfactant is particularly preferred in view of defoaming properties.

Examples of the water-soluble high molecule compound usable in the developing solution according to the invention include soybean polysaccharide, modified starch, gum arabic, dextrin, a cellulose derivative (for example, carboxymethyl cellulose, carboxyethyl cellulose or methyl cellulose) or a modified product thereof, pullulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, use can be made of publicly known ones. For example, as a commercial product, Soyafive (trade name, manufactured by Fuji Oil Co., Ltd.) is available and various grade products can be used. The soybean polysaccharide preferably usable herein is one having a viscosity in a range from 10 to 100 mPa/sec in a 10% by mass aqueous solution thereof.

As the modified starch, known modified starch can be used. The modified starch can be prepared by, for example, a method which comprises digesting starch of corn, potato, tapioca, rice, wheat or the like to give 5 to 30 glucose residues per molecule with the use of an enzyme, etc., and then adding oxypropylene thereto in an alkali.

Two or more kinds of the water-soluble high molecule compounds may be used in combination. The content of the water-soluble high molecule compound in the developing solution is preferably from 0.1 to 20% by mass, more preferably from 0.5 to 10% by mass.

The developing solution to be used in the invention may contain an organic solvent. Examples of the organic solvent that can be contained in the developing solution include an aliphatic hydrocarbon (e.g., hexane, heptane, Isopar E, Isopar H, Isopar G (manufactured by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) and a polar solvent.

Examples of the polar solvent include an alcohol (for example, methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (for example, acetone, methyl ethyl ketone, ethyl butyl ketone, methyl isobutyl ketone or cyclohexanone), an ester (for example, ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate or butyl levulinate) and others (for example, triethyl phosphate, tricresyl phosphate, N-phenylethanolamine or N-phenyldiethanolamine).

Further, when the organic solvent is insoluble in water, it may be solubilized in water with the use of a surfactant or the like before using. In the case where the developing solution contains the organic solvent, the concentration of the organic solvent is desirably less than 40% by mass in view of safety and inflammability.

In addition to the components as described above, the developing solution to be used in the invention may contain an antiseptic agent, a chelating agent, a defoaming agent, an organic acid, an inorganic acid, an inorganic salt or the like.

Preferable examples of the antiseptic agent include phenol or a derivative thereof, formalin, an imidazole derivative, sodium dehydroacetate, a 4-isothiazolin-3-one derivative, benzisotiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol such as 2-bromo-2-nitropropane-1,3-diol, 1,1-dibromo-1-nitro-2-ethanol or 1,1-dibromo-1-nitro-2-propanol.

Examples of the chelating agent include ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof, sodium salt thereof; hydroxyethylethylenediaminetriacetic acid, potassium salt thereof, sodium salt thereof, nitrilotriacetic acid, sodium salt thereof, organic phosphonic acids, for example, 1-hydroxyethane-1,1-diphosphonic acid, potassium salt thereof, sodium salt thereof; an organic phosphonic acid such as aminotri(methylenephosphonic acid), potassium salt thereof, sodium salt thereof, and phophonoalkanetricarboxylic acids. A salt of an organic amine is also effectively used in place of the sodium salt or potassium salt in the chelating agents as described above.

As the defoaming agent, use can be made of, for example, a conventional silicone-based self-emulsifying type or emulsifying type defoaming agent, and a nonionic surfactant having HLB of 5 or less. The silicone defoaming agent is preferably used.

Either an emulsifying dispersing type or a solubilizing type can be used.

Examples of the organic acid include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and an organic phosphonic acid. The organic acid can also be used in the form of an alkali metal salt or an ammonium salt.

Examples of the inorganic acid and inorganic salt include phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate.

The developing solution described above can be used as a developing solution and a development replenisher for an exposed negative-working lithographic printing plate precursor. It is preferably applied to an automatic processor as will be described hereinafter. In the case of conducting the development processing using an automatic processor, the developing solution becomes fatigued with an increase in the processing amount. In such a case, the processing ability may be restored by using a replenisher or a fresh developing solution. Such a replenishment system can be preferably applied to the plate-making method of the lithographic printing plate precursor according to the invention.

The development processing using the aqueous solution having pH of 2 to 10 according to the invention is preferably performed by using an automatic processor equipped with a supplying means for a developing solution and a rubbing member. As the automatic processor, there are enumerated an automatic processor in which a lithographic printing plate precursor after image-recording is subjected to a rubbing treatment while it is transporting described in JP-A-2-220061 and JP-A-60-59351, and an automatic processor in which a lithographic printing plate precursor after image-recording placed on a cylinder is subjected to a rubbing treatment while rotating the cylinder described in U.S. Pat. Nos. 5,148,746 and 5,568,768 and British Patent 2,297,719. Among them, the automatic processor using a rotating brush roll as the rubbing member is particularly preferred.

The rotating brush roller preferably usable in the invention can be appropriately selected by taking account, for example, of scratch resistance of the image area and nerve strength of the support of the lithographic printing plate precursor. As for the rotating brush roller, a publicly known rotating brush roller produced by implanting a brush material in a plastic or metal roller can be used. For example, use can be made of a rotating brush roller described in JP-A-58-159533 and JP-A-3-100554, or a brush roller described in JP-B-62-167253, in which a metal or plastic groove-type member having implanted therein in rows a brush material is closely radially wound around a plastic or metal roller acting as a core.

As the brush material, a plastic fiber (for example, a polyester-based synthetic fiber such as polyethylene terephthalate or polybutylene terephthalate; a polyamide-based synthetic fiber such as nylon 6.6 or nylon 6.10; a polyacrylic synthetic fiber such as polyacrylonitrile or polyalkyl(meth)acrylate; and a polyolefin-based synthetic fiber such as polypropylene or polystyrene) can be used. It is preferable to use a brush material having a fiber bristle diameter of 20 to 400 μm and a bristle length of 5 to 30 min.

The outer diameter of the rotating brush roller is preferably from 30 to 200 nm, and the peripheral velocity at the tip of the brush rubbing the plate surface is preferably from 0.1 to 5 m/sec.

Further, it is preferred to use a plurality, that is, two or more of the rotating brush rollers.

The rotary direction of the rotating brush roller to be used in the invention may be the same direction as the transporting direction of the lithographic printing plate precursor of the invention or the opposite direction thereto. In the case of using two or more rotating brush rollers in an automatic processor as shown in FIGURE, it is preferred that at least one rotating brush roller rotates in the same direction as the transporting direction of the lithographic printing plate precursor of the invention and at least one rotating brush roller rotates in the opposite direction thereto. Owing to such arrangement, the photosensitive layer in an non-image area can be more steadily removed. Further, it is also effective that the rotating brush roller is reciprocated in the rotation axis direction of the brush roller.

DESCRIPTION OF REFERENCE NUMERICALS IN THE FIGURE

1: Rotating brush roll
2: Receiver roll
3: Transporting roll
4: Transport guide plate
5: Spray pipe
6: Pipe line
7: Filter
8: Plate feed tray
9: Plate discharge tray
10: Developing solution tank
11: Circulation pump
12: Plate Although the developing solution can be used at an arbitrary temperature, the temperature is preferably from 10° C. to 50° C.

In the invention, the lithographic printing plate having been rubbed may be subsequently subjected to water washing, a drying treatment and an oil-desensitization treatment, if desired. In the oil-desensitization treatment, use can be made of a publicly known oil-desensitizing solution.

Further, in a plate-making process whereby a lithographic printing plate is obtained from the lithographic printing plate precursor according to the invention, the entire surface of the lithographic printing plate precursor may be heated, if desired, before or during the exposure or between the exposure and the development. By this heating treatment, the image-forming reaction in the photosensitive layer is accelerated to thereby bring about advantages such as improvement in the sensitivity and printing durability and stabilization of the sensitivity. In order to improve the image strength and printing durability, it is also effective to perform entire after-heating or entire exposure of the image after the development. In usual, the heating before the development is preferably performed under a mild condition of 150° C. or lower. When the temperature is too high, there arises a problem such as undesirable fogging in a non-image area. On the other hand, the heating after the development can be performed under a very strong condition. That is, the heat treatment is carried out usually within a temperature range of 200 to 500° C. When the temperature is too low, a sufficient effect of strengthening the image may not be obtained. When the temperature is excessively high, on the other hand, there arise problems of deterioration of the support and thermal decomposition of the image area.

Prior to the development processing as described above, the lithographic printing plate precursor is imagewise exposed through a transparent original having a line image, a halftone dot image or the like, or imagewise exposed, for example, by scanning of laser beam based on digital data.

The desirable wavelength of the light source is from 350 nm to 450 nm. More specifically speaking, it is appropriate to employ an InGaN semiconductor laser. The exposure mechanism may be either an internal drum system, an external drum system or a flat bed system.

Other examples of the exposure light source which can be used in the invention include an ultra-high pressure mercury lamp, a high pressure mercury lamp, a medium pressure mercury lamp, a low pressure mercury lamp, a chemical lamp, a carbon arc lamp, a xenon lamp, a metal halide lamp, various visible or ultraviolet laser lamps, a fluorescent lamp, a tungsten lamp and sunlight.

As for the available laser light source of 350 to 450 nm, use can be made of the followings.

Gas lasers such as Ar ion laser (364 nm, 351 nm, 10 mW to 1 W), Kr ion laser (356 nm, 351 nm, 10 mW to 1 W) and He—Cd laser (441 nm, 325 nm, 1 mW to 100 mW); solid lasers such as a combination of Nd:YAG ($YVO_4$) with SHG crystals×twice (355 nm, 5 mW to 1 W) and a combination of Cr:LiSAF with SHG crystal (430 nm, 10 mW); semiconductor laser systems such as a $KNbO_3$ ring resonator (430 nm, 30 mW), a combination of a waveguide-type wavelength conversion element with an AlGaAs or InGaAs semiconductor (380 nm to 450 nm, 5 mW to 100 mW), a combination of a waveguide-type wavelength conversion element with an AlGaInP or AlGaAs semiconductor (300 nm to 350 nm, 5 mW to 100 mW), and AlGaInN (350 nm to 450 nm, 5 mW to 30 mW); pulse lasers such as $N_2$ laser (337 nm, pulse 0.1 to 10 mJ) and XeF (351 nm, pulse 10 to 250 mJ). Among these light sources, the AlGaInN semiconductor laser (commercially available InGaN semiconductor laser, 400 to 410 nm, 5 to 30 mW) is particularly preferable in view of the wavelength characteristics and cost.

As for the exposure apparatus for the lithographic printing plate precursor of scanning exposure system, the exposure mechanism includes an internal drum system, an external drum system and a flat bed system. As the light source, use can be preferably made of a light source which is selected from among those described above and capable of conducting continuous oscillation. In practice, the exposure apparatuses described below are particularly preferable from the viewpoint of the relationship between the sensitivity of photosensitive material and the time for plate-making.

A single beam to triple beam exposure apparatus of internal drum system, using one or more gas or solid laser light sources so as to provide a semiconductor laser having a total output of 20 mW or more.

A multi-beam (from 1 to 10 beams) exposure apparatus of flat bed system, using one or more semiconductor, gas or solid lasers so as to provide a total output of 20 mW or more.

A multi-beam (from 1 to 9 beams) exposure apparatus of external drum system, using one or more semiconductor, gas or solid lasers so as to provide a total output of 20 mW or more.

A multi-beam (10 or more beams) exposure apparatus of external drum system, using one or more semiconductor or solid lasers so as to provide a total output of 20 mW or more.

In the laser direct drawing-type lithographic printing plate precursor, the following equation (eq 1) is usually established among the sensitivity X ($J/cm^2$) of photosensitive material, the exposure area S ($cm^2$) of photosensitive material, the power q (W) of one laser light source, the number n of lasers and the total exposure time t (s):

$$X \cdot S = n \cdot q \cdot t \quad (eq\ 1)$$

i) Internal Drum (Single Beam) System

The following equation (eq 2) is ordinarily established among the laser revolution number f (radian/s), the sub-scanning length Lx (cm) of photosensitive material, the resolution Z (dot/cm) and the total exposure time t (s):

$$f \cdot Z \cdot t = Lx \quad (eq\ 2)$$

ii) External Drum (Multi-Beam) System

The following equation (eq 3) is ordinarily established among the drum revolution number F (radian/s), the sub-scanning length Lx (cm) of photosensitive material, the resolution Z (dot/cm), the total exposure time t (s) and the number (n) of beams:

$$F \cdot Z \cdot n \cdot t = Lx \quad (eq\ 3)$$

iii) Flat Bed (Multi-Beam) System

The following equation (eq 4) is ordinarily established among the revolution number H (radian/s) of polygon mirror, the sub-scanning length Lx (cm) of photosensitive material, the resolution Z (dot/cm), the total exposure time t (s) and the number (n) of beams:

$$H \cdot Z \cdot n \cdot t = Lx \quad (eq\ 4)$$

By substituting the resolution (2,560 dpi) required for a practical printing plate, the plate size (A1/B1, sub-scanning length: 42 inch), the exposure condition of about 20 sheets/hour and the photosensitive characteristics (photosensitive wavelength, sensitivity: about 0.1 $mJ/cm^2$) of the lithographic printing plate precursor according to the invention for the above equations, it can be understood that the lithographic printing plate precursor according to the invention is preferably combined with a multi-beam exposure system using a laser having a total output of 20 mW or more. By taking account of operability, cost and the like, furthermore, it is most preferable to combine the lithographic printing plate precursor according to the invention with an external drum system semiconductor laser multi-beam (10 or more beams) exposure apparatus.

EXAMPLES

Next, the present invention will be described in greater detail with reference to the following Examples, but the invention should not be construed as being limited thereto.

[Preparation of Support 1]

An aluminum plate (material: 1050) having a thickness of 0.3 mm is subjected to a degrease treatment with a 10% by mass aqueous sodium aluminate solution at 50° C. for 30 seconds to thereby remove rolling oil on the surface thereof. Thereafter, the aluminum plate surface is sand grained by using three nylon brushes implanted with bundled bristles having a diameter of 0.3 mm and an aqueous suspension (specific gravity: 1.1 g/cm$^3$) of pumice having a median diameter of 25 µm, and then thoroughly washed with water. The plate is etched by dipping it in an 25% by mass aqueous sodium hydroxide solution at 45° C. for 9 seconds and, after washing with water, dipped in a 20% by mass aqueous nitric acid solution at 60° C. for 20 seconds, followed by washing with water. The etching amount of the sand grained surface is about 3 g/m$^2$.

Subsequently, the aluminum plate is subjected to a continuous electrochemical surface roughening treatment using alternate current voltage of 60 Hz. The electrolytic solution used is a 1% by mass aqueous nitric acid solution (containing 0.5% by mass of aluminum ion) at a liquid temperature of 50° C. The electrochemical surface roughening treatment is performed using a rectangular wave alternate current having a trapezoidal waveform such that the time TP necessary for the current value to reach the peak from zero is 0.8 msec and the duty ratio is 1:1, and disposing a carbon electrode as the counter electrode. The auxiliary anode used is ferrite. The current density is 30 A/dm$^2$ expressed in the peak value of current, and 5% of the current flowing from the power source is divided to the auxiliary anode. The quantity of electricity at the nitric acid electrolysis is 175 C/dm$^2$ when the aluminum plate is serving as the anode. Subsequently, the aluminum plate is washed with water by spraying.

Next, the aluminum plate is subjected to an electrochemical surface roughening treatment in the same manner as in the nitric acid electrolysis as described above by using, as the electrolytic solution, a 0.5% by mass aqueous hydrochloric acid solution (containing 0.5% by mass of aluminum ion) at a liquid temperature of 50° C. under the conditions that the quantity of electricity is 50 C/dm$^2$ when the aluminum plate is serving as the anodes and then washed with water by spraying. The plate is then treated in a 15% by mass aqueous sulfuric acid solution (containing 0.5% by mass of aluminum ion) as the electrolytic solution at a current density of 15 A/dm$^2$ to provide a direct current anodic oxide film of 2.5 g/m$^2$, followed by washing with water drying.

The center line average roughness (Ra) (JIS B0601) of the thus-treated aluminum plate that is measured with a stylus having a diameter of 2 µm is 0.51 µm.

Further, Undercoat Solution (1) shown below is bar-coated to give a dry coating amount of 10 mg/m$^2$ and dried in an oven at 80° C. for 10 seconds to prepare a support having an undercoat layer to be used in the subsequent experiment.

| Undercoat solution (I) | |
| --- | --- |
| Undercoat compound (1) | 0.017 g |
| Methanol | 9.00 g |
| Water | 1.00 g |

| Undercoat solution (I) |
| --- |
| Undercoat Compound (1) 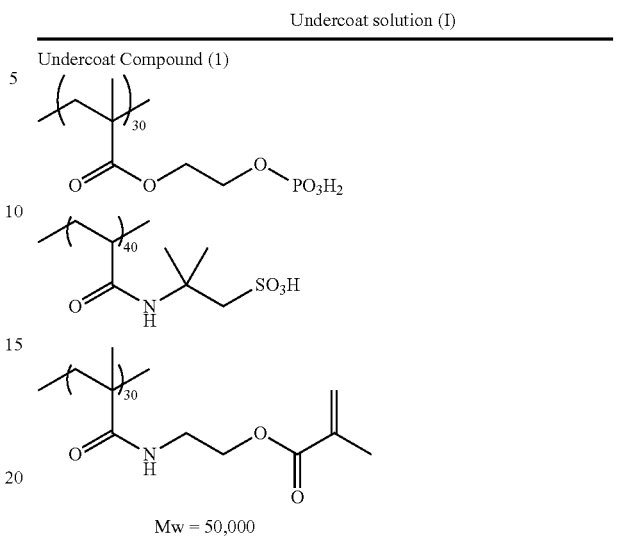 Mw = 50,000 |

Synthesis Example 1

Synthesis of Graft Unit 1

To a three-necked flask provided with a condenster and a stirrer, 75 g of 1-methoxy-2-propanol is introduced and heated to 75° C. Under a nitrogen gas stream, a solution containing 50 g of dimethylacrylamide, mercaptoacetic acid and 0.23 g of V-601 (trade name, manufactured by WAKO PURE CHEMICAL INDUSTRIES, LTD.) dissolved in 75 g of 1-methoxy-2-propanol is added dropwise over 2.5 hours. After reacting at 75° C. for additional 2 hours, the liquid reaction mixture is poured into hexane and a copolymer is precipitated. The precipitate is collected by filtration, washed and dried to give graft unit precursor Q-1. The mass-average molecular weight of this product that is determined by the gel permeation chromatograph (GPC) method using polystyrene as a standard is 1000.

10 g of the obtained precursor Q-1 is dissolved in xylene. After adding 1.3 g of glycydyl methacrylate, the mixture is stirred at 140° C. for 3 hours and purified to give Graft Unit 1.

Graft Units 2 to 9 and 11 are synthesized in the same manner.

Synthesis Example 2

Synthesis of Graft Unit 10

To a two-necked flask provided with a stirrer, 12 g of 3-mercapto-1,2-propanediol is introduced and then 48 g of AM-90G (EO-denatured acrylate; manufactured by SHIN NAKAMURA CHEMICAL Co., Ltd.) is added dropwise thereto. After stirring the mixture at room temperature for 6 hours, the formation of Graft Unit 10 is confirmed by NMR.

Synthesis Example 3

Synthesis of Binder Polymer 1

To a three-necked flask provided with a condenster and a stirrer, 40 g of 1-methoxy-2-propanol is introduced and heated to 75° C. Under a nitrogen gas stream, a solution containing 29.7 g of methyl methacrylate, 3 g of Graft Unit 1 and 0.35 g of V-601 (trade name, manufactured by WAKO PURE CHEMICAL INDUSTRIES, LTD.) dissolved in 40 g of 1-methoxy-2-propanol is added dropwise over 2.5 hours. After reacting at 75° C. for additional 2 hours, the liquid reaction mixture is poured into water and a copolymer is precipitated. The precipitate is collected by filtration, washed and dried to give Binder Polymer 1. The mass-average molecular weight of this product that is determined by the gel permeation chromatograph (GPC) method using polystyrene as a standard is 70000.

Binder Polymers 1 to 6 and Comparative Binder Polymers 1 and 2 are synthesized in the same manner.

Synthesis Example 4

Synthesis of Binder Polymer 7

In a 500 ml three-necked flask provided with a condenster and a stirrer, 1 g of Graft Unit 7, 49 g of polypropylene glycol (average molecular weight 1000, manufactured by WAKO PURE CHEMICAL INDUSTRIES, LTD.) and 5.25 g of 3,3-dimethyl-1,2-propanediol were dissolved in 80 g of 1-methyl-2-pyrrolidone. Next, 13.3 g of isophorone diisocyanate, 6.7 g of 1,6-hexamethylene diisocyanate and 0.1 g of dibutyltin laurate are added thereto and the mixture is reacted under heating to 100° C. for 8 hours. Then, it is diluted with 80 g of 1-methoxy-2-propanol and stirred for 30 minutes. The liquid reaction mixture is powered into 3 L of water under stirring and thus a white polymer is precipitated. The precipitate is collected by filtration, washed and dried to give Binder Polymer 7. The mass-average molecular weight of this product that is determined by the gel permeation chromatograph (GPC) method using polystyrene as a standard is 60000.

Binder polymers 8, 9, 10 and 11 are synthesized in the same manner.

[Synthesis in Comparative Examples 1 and 2]

To a three-necked flask provided with a condenster and a stirrer, 35 g of 1-methoxy-2-propanol is introduced and heated to 75° C. Under a nitrogen gas stream, a solution containing 27 g of methyl methacrylate, 3 g of N,N-dimethylacrylamide and 0.7 g of V-601 (trade name, manufactured by WAKO PURE CHEMICAL INDUSTRIES, LTD.) dissolved in 35 g of 1-methoxy-2-propanol is added dropwise over 2.5 hours. After reacting at 75° C. for additional 2 hours, the liquid reaction mixture is poured into water and a copolymer is precipitated. The precipitate is collected by filtration, washed and dried to give Comparative Polymer 1. The mass-average molecular weight of this product that is determined by the gel permeation chromatograph (GPC) method using polystyrene as a standard is 60000. Comparative Polymer 2 is obtained in the same manner.

| No | Binder structure | a/b | MW |
|---|---|---|---|
| Comp. Ex. 1 | | 90/10 | 60000 |
| Comp. Ex. 2 | | 70/30 | 50000 |

[Preparation of Lithographic Printing Plate Precursor (1)]

On the support having the undercoat layer prepared above, Coating Solution (1) for Photosensitive Layer having following composition is bar-coated and dried in an oven at 70° C. for 60 seconds to form a photosensitive layer having a dry coating amount of 1.1 g/m². On the photosensitive layer, Coating Solution (1) for Protective Layer having the following composition is bar-coated to give a dry coating amount of 0.75 g/m² and dried at 125° C. for 70 seconds to prepare Lithographic Printing Plate Precursor (1).

| Coating Solution (1) for Photosensitive Layer | |
|---|---|
| Binder Polymer shown below (listed in Table 1) | 0.54 g |
| Polymerizable compound | 0.40 g |
| (iocyanuric acid EO-denatured triacrylate; ARONIX M-315, manufactured by TOAGOSEI Co., Ltd.) | |
| Polymerizable compound | 0.08 g |
| (ethoxylated trimethylol-propane triacrylate; SR9035, added EO moles: 15, molecular weight 1000; manufactured by NIPPON KAYAKU Co., Ltd.) | |
| Sensitizing Dye (1) shown below | 0.06 g |
| Polymerization Initiator (1) shown below | 0.18 g |
| Chain Transfer Agent (1) shown below | 0.07 g |
| ε-phthalocyanine pigment dispersion | 0.40 g |
| (pigment: 15 parts by mass, dispersant binder polymer: 10 parts by mass, solvent: cyclohexane/methoxypropyl acetate/1-methoxy-2-propanol = 15 parts by mass/20 parts by mass/40 parts by mass) | |
| Heat polymerization inhibitor N-nitrosophenylhydroxylamine aluminum salt | 0.01 g |
| Water-Soluble Fluorinated Surfactant (1) shown below | 0.001 g |
| Polyoxyethylene-polyoxypropylene condensate | 0.04 g |
| (Pluronic L44, manufactured by ADEKA Co.) | |
| Tetraethylamine hydrochloride | 0.01 g |
| 1-Methoxy-2-propanol | 3.5 g |
| Methyl ethyl ketone | 8.0 g |

Sensitizing Dye (1)

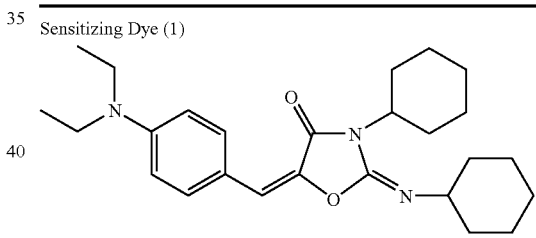

Polymerization Initiator (1)

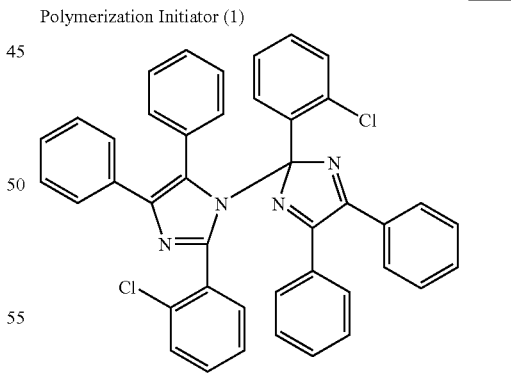

Chain Transfer Agent (1)

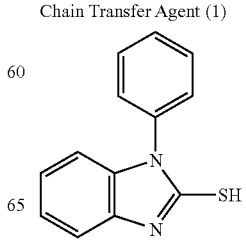

-continued

Coating Solution (1) for Photosensitive Layer

Fluorinated Surfactant (1)

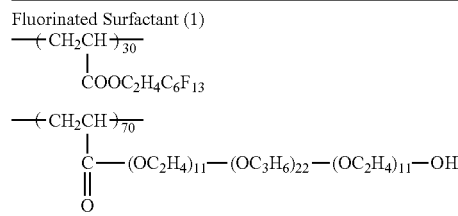

Coating Solution (1) for Protective Layer

| | |
|---|---|
| Polyvinyl alcohol (degree of saponification 98% by mol, degree of polymerization 500) | 40 g |
| Polyvinylpyrrolidone (molecular weight 50000) | 5 g |
| Poly(vinylpyrrolidone/vinyl acetate (1/1)) molecular weight 70000 | 0.5 g |
| Surfactant (EMALEX 710, manufactured by Nihon-Emulsion Co., Ltd.) | 0.5 g |
| Water | 950 g |

Next, the oxygen transmission rate of the protective layer is measured under the following conditions. As a result, the oxygen transmission rate of the protective layer is 3.8 ml/($m^2$ day atom).

(Measurement of Oxygen Transmission Rate)

One surface of base paper for photographic printing paper having a thickness of about 200 μm both surfaces of which have been coated with polyethylene having a thickness of about 20 μm, is coated with the protective layer in the same manner as described above with respect to the coating of the protective layer, followed by drying to prepare a sample for measurement. The oxygen transmission rate of the base paper for photographic printing paper previously measured under the measurement conditions as specified below is about 700 ml/($m^2$ day atom) and it is a sufficiently negligible value for the measurement of the oxygen transmission rate of the protective layer.

By using the sample thus prepared, the oxygen transmission rate [ml/($m^2$ day atom)] is measured by using OX-TRAN2/20 (manufactured by Mocon Inc.) in accordance with the vapor permeation rate testing method described in JIS K712613 and ASTM D3985 at 25° C. and 60% RH.

Examples 1 to 11 and Comparative Examples 1 and 2

(1) Exposure, Development and Printing

Lithographic Printing Plate Precursor (1) described above is subjected to image exposure with Violet semiconductor laser plate setter Vx9600 (loading InGaN system semiconductor laser, emission 405 nm±10 nm/output 30 mW, manufactured by Fuji Film Electronic Imaging Ltd.). Plain dot of 35% is imaged by the quantity of printing plate exposure of 0.09 mJ/$cm^2$ and the resolution of the image of 2,438 dpi with FM screen (TAFFETA 20, manufactured by Fuji Photo Film Co., Ltd.).

Then, development processing is performed in an automatic development processor having a structure shown in FIGURE with the use of Developing Solution (1) having the composition shown below. The pH of the developing solution is 5. The automatic development processor is an automatic processor having two rotating brush rollers. In the rotating brush rollers, the first brush roller is a brush roller having an outer diameter of 90 mm and being implanted with fiber of polybutylene terephthalate (bristle diameter: 200 μm, bristle length: 17 mm), and this brush roller is rotated at 200 rpm in the same direction as the transporting direction (peripheral velocity at the tip of brush: 0.94 m/sec). The second brush roller is a brush roller having an outer diameter of 60 mm and being implanted with fiber of polybutylene terephthalate (bristle diameter: 200 μm, bristle length: 17 mm), and this brush roller is rotated at 200 rpm in the opposite direction to the transporting direction (peripheral velocity at the tip of brush: 0.63 m/sec). The transportation of the lithographic printing plate precursor is performed at a transporting speed of 100 cm/min.

The developing solution is supplied on the surface of the lithographic printing plate precursor by showering from a spray pipe using a circulation pump. The tank volume for the developing solution is 10 L.

| Developing Solution (1) | |
|---|---|
| Water | 100 g |
| Benzyl alcohol | 1 g |
| Anionic surfactant shown below | 1 g |
| Dioctysulfosuccinic acid ester sodium salt | 0.5 g |
| Gum arabic | 1 g |
| Ethylene glycol | 0.5 g |
| Ammonium primary phosphate | 0.05 g |
| Citric acid | 0.05 g |
| Ethylenediamine tetraacetate tetrasodium salt | 0.05 g |
| Defoaming agent FS Antifoam DR110N (manufactured by Dow Corning, silicone-based emulsion) | 0.1 g |

Anionic Surfactant

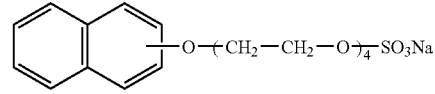

[Evaluation]

Using the lithographic printing plate precursors prepared above, developability and printing durability are evaluated by the following methods. Table 1 summarizes the results.

<Developability>

The obtained lithographic printing plate precursors are exposed as discussed above.

After the exposure, the non-image area of each lithographic printing plate precursor is observed with the naked eye and the presence or absence of the residue of the photosensitive layer is evaluated.

A: No residue. B: Little residue. C: Obvious residue.

<Printing Durability>

With an increase in prints, the photosensitive layer abrades away and the ink receptivity is lowered, which results in a decrease in ink density on printing papers. The printing durability is evaluated based on the number of printing paper sheets obtained until the ink density (reflection density) decreases by 0.1 from that at the initiation of printing.

TABLE 1

| | Binder polymer | Acid value (meq/g) | Developability | Printing durability |
|---|---|---|---|---|
| Ex. 1 | 1 | 0 | A | 40000 |
| Ex. 2 | 2 | 0 | A | 55000 |
| Ex. 3 | 3 | 0 | A | 40000 |
| Ex. 4 | 4 | 0 | A | 50000 |
| Ex. 5 | 5 | 0 | A | 50000 |

TABLE 1-continued

| | Binder polymer | Acid value (meq/g) | Developability | Printing durability |
|---|---|---|---|---|
| Ex. 6 | 6 | 0 | A | 60000 |
| Ex. 7 | 7 | 0 | A | 100000 |
| Ex. 8 | 8 | 0 | A | 110000 |
| Ex. 9 | 9 | 0 | A | 120000 |
| Ex. 10 | 10 | 0 | A | 110000 |
| Ex. 11 | 11 | 0 | A | 100000 |
| Comp. Ex. 1 | Comparative polymer 1 | 0 | C | 30000 |
| Comp. Ex. 2 | Comparative polymer 2 | 0 | A | 10000 |

When a polymer having a hydrophilic group of non-graft type is used as in Comparative Example 1 or 2, a large amount of hydrophilic groups should be introduced to impart developability, which lowers printing durability.

Example 12

Lithographic Printing Plate Precursor (1) is subjected to image exposure with Violet semiconductor laser plate setter Vx9600 (loading InGaN system semiconductor laser, emission 405 nm±10 nm/output 30 mW, manufactured by Fuji Film Electronic Imaging Ltd.). Plain dot of 35% is imaged by the quantity of printing plate exposure of 0.09 mJ/cm$^2$ and the resolution of the image of 2,438 dpi with FM screen (TAF-FETA 20, manufactured by Fuji Photo Film Co., Ltd.). After the exposure, the lithographic printing plate precursor is imagewise exposed and, within 30 minutes, subjected to development processing with an automatic developing processor LP1250PLX (manufactured by Fuji Photo Film Co., Ltd.). The automatic developing processor consists of a heating unit/a washing unit/a developing unit/a rinsing unit/a finishing unit in this order, and heating condition in the heating unit is 100° C., 10 seconds. All the tanks of the washing unit, developing unit, rinsing unit, and finishing unit are charged with Developing Solution (1) as described above. The temperature of the developing solution is 28° C., and the lithographic printing plate is carried at transporting speed of 110 cm/min.

After the development, the non-image area and the image area of the lithographic printing plate are observed with the naked eye. The photosensitive layer in the non-image area is completely removed and uniform plain dots are formed. When the lithographic printing plate is used in printing according to the above printing condition, good printed matter containing uniform plain dots and free from soiling in the non-image area is obtained. When evaluated in the same manner as in Examples 1 to 11, the developability is A and the printing durability is 70000.

According to the invention, it is possible to provide a lithographic printing plate precursor, which is excellent in developability with water or an aqueous developing solution since a binder polymer having a graft chain is used in the photosensitive layer and a hydrophilic graft chain having a hydrophilic group is employed as the graft chain and which is also excellent in printing durability, and a method for preparation of a lithographic printing plate.

By using the above-described binder polymer having a hydrophilic graft chain in a non-alkali development system with, for example, a developing solution having pH of 2.0 to 10.0, in particular, the developability is improved and developing can be conducted using a smaller amount of a hydrophilic group, compared with the case of employing a non-graft type. Although this mechanism has not been clarified yet, it is estimated that an increase in the mobility at the hydrophilic site and the formation of a water penetration path caused by grafting would contribute to the improvement in developability. Moreover, the printing durability can be improved by a decrease in the amount of the introduced hydrophilic groups owing to grafting.

The entire disclosure of each and every foreign patent application from which the benefit of foreign priority has been claimed in the present application is incorporated herein by reference, as if fully set forth.

What is claimed is:

1. A lithographic printing plate precursor comprising:
a support; and
an image forming layer formed from a photosensitive composition,
wherein the photosensitive composition comprises:
a photopolymerization initiator;
a polymerizable compound;
a sensitizing dye which absorbs light of from 350 nm to 450 nm; and
a binder polymer comprising a graft chain having a molecular weight of from 500 to 50000, and
the graft chain is a hydrophilic graft chain comprising a hydrophilic group,
wherein the hydrophilic group is a hydroxyl group; an amino group; an amide group; a salt obtained by neutralizing a carboxylic acid, sulfonic acid or phosphoric acid; or an ammonium salt; and
a main chain of the binder polymer comprising a graft chain comprises a crosslinking group.

2. The lithographic printing plate precursor according to claim 1, wherein the hydrophilic graft chain comprises the hydrophilic group in a side chain thereof.

3. The lithographic printing plate precursor according to claim 1, wherein the binder polymer has an acid value of 0.3 meq/g or less.

4. The lithographic printing plate precursor according to claim 1, wherein the image forming layer in an unexposed area can be removed in the presence of a developing solution having pH of 2 to 10.

5. The lithographic printing plate precursor according to claim 1, wherein the main chain of the binder polymer comprising a graft chain is a (meth)acrylic resin or a polyurethane resin.

6. The lithographic printing plate precursor according to claim 1, wherein the hydrophilic graft chain comprises a crosslinkable group.

7. The lithographic printing plate precursor according to claim 1, wherein the hydrophilic group is a hydroxyl group; an amino group; or an amide group.

8. The lithographic printing plate precursor according to claim 1, wherein the hydrophilic group is a salt obtained by neutralizing a sulfonic acid.

9. The lithographic printing plate precursor according to claim 1, wherein an ether bond is located in a main chain of a graft chain skeleton.

10. The lithographic printing plate precursor according to claim 1, wherein the binder polymer is a polyurethane resin.

11. The lithographic printing plate precursor according to claim 1, wherein the binder polymer contains from 0.1 to 20% by mol of the polymerization unit having the graft chain.

12. The lithographic printing plate precursor according to claim 11, wherein the binder polymer contains from 1 to 5% by mol of the polymerization unit having the graft chain.

13. The lithographic printing plate precursor according to claim 6, wherein the crosslinkable group is a functional group represented by one of the following general formulae (1), (2) and (3):

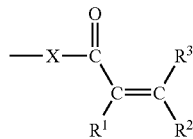

General formula (1)

wherein $R^1$, $R^2$, $R^3$ each independently represents a monovalent organic group, and X represents an oxygen atom, a sulfur atom or $N(R^{12})$—, wherein $R^{12}$ represents a hydrogen atom or a monovalent organic group;

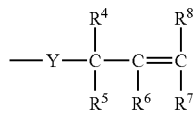

General formula (2)

wherein $R^4$, $R^5$, $R^6$, $R^7$ and $R^8$ each independently represents a monovalent organic group, and Y represents an oxygen atom, a sulfur atom or $N(R^{12})$—, wherein $R^{12}$ represents a hydrogen atom or a monovalent organic group;

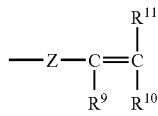

General formula (3)

wherein $R^9$ represents a hydrogen atom or an alkyl group which may have a substituent, $R^{10}$ and $R^{11}$ each independently represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent, and Z represents an oxygen atom, a sulfur atom, $-N(R^{13})-$ or a phenylene group which may have a substituent, wherein $R^{13}$ represents an alkyl group which may have a substituent.

14. The lithographic printing plate precursor according to claim 6, wherein the content of the polymerization unit having a crosslinkable group in the graft chain is from 5 to 50% by mol based on the polymerization units constituting the graft chain.

* * * * *